(12) United States Patent
Sacolick et al.

(10) Patent No.: US 10,591,561 B2
(45) Date of Patent: Mar. 17, 2020

(54) PULSE SEQUENCES FOR LOW FIELD MAGNETIC RESONANCE

(71) Applicant: Hyperfine Research, Inc., Guilford, CT (US)

(72) Inventors: Laura Sacolick, Madison, CT (US); Matthew Scot Rosen, Somerville, MA (US); Gregory L. Charvat, Guilford, CT (US); Jonathan M. Rothberg, Guilford, CT (US); Mathieu Sarracanie, Somerville, MA (US)

(73) Assignee: Hyperfine Research, Inc., Guilford, CT (US)

( * ) Notice: Subject to any disclaimer, the term of this patent is extended or adjusted under 35 U.S.C. 154(b) by 575 days.

(21) Appl. No.: 14/938,430

(22) Filed: Nov. 11, 2015

(65) Prior Publication Data

US 2016/0131727 A1  May 12, 2016

Related U.S. Application Data

(60) Provisional application No. 62/078,378, filed on Nov. 11, 2014.

(51) Int. Cl.
*G01R 33/44* (2006.01)
*G01R 33/48* (2006.01)
*G01R 33/561* (2006.01)
*G01R 33/36* (2006.01)
*G01R 33/38* (2006.01)
*G01R 33/381* (2006.01)

(52) U.S. Cl.
CPC ....... *G01R 33/445* (2013.01); *G01R 33/4816* (2013.01); *G01R 33/5614* (2013.01); *G01R 33/3671* (2013.01); *G01R 33/381* (2013.01); *G01R 33/3806* (2013.01)

(58) Field of Classification Search
CPC .............. G01R 33/445; G01R 33/4816; G01R 33/5614; G01R 33/3671; G01R 33/3806; G01R 33/381
USPC ........................................................ 324/318
See application file for complete search history.

(56) References Cited

U.S. PATENT DOCUMENTS 4,661,775 A * 4/1987 Kormos ........... G01R 33/56563
324/307
4,885,542 A * 12/1989 Yao .................. G01R 33/56518
324/313

(Continued)

OTHER PUBLICATIONS

Invitation to Pay Additional Fees dated Jan. 7, 2016 in connection with International Application No. PCT/US2015/060177.
(Continued)

*Primary Examiner* — Patrick Assouad
*Assistant Examiner* — Demetrius R Pretlow
(74) *Attorney, Agent, or Firm* — Wolf, Greenfield & Sacks, P.C.

(57) ABSTRACT

A low-field magnetic resonance imaging (MRI) system. The system includes a plurality of magnetics components comprising at least one first magnetics component configured to produce a low-field main magnetic field $B_0$ and at least one second magnetics component configured to acquire magnetic resonance data when operated, and at least one controller configured to operate one or more of the plurality of magnetics components in accordance with at least one low-field zero echo time (LF-ZTE) pulse sequence.

35 Claims, 19 Drawing Sheets

(56) References Cited

U.S. PATENT DOCUMENTS

| | | | | |
|---|---|---|---|---|
| 5,245,286 | A * | 9/1993 | Carlson | G01R 33/56563 324/319 |
| 5,655,533 | A * | 8/1997 | Petropoulos | G01R 33/385 324/318 |
| 5,814,987 | A * | 9/1998 | Smith | G01R 33/446 324/300 |
| 6,211,677 | B1 * | 4/2001 | Burl | G01R 33/36 324/322 |
| 6,445,184 | B1 * | 9/2002 | Tanttu | G01R 33/56341 324/307 |
| 6,504,373 | B2 * | 1/2003 | Tsuda | G01R 33/3815 324/318 |
| 6,624,630 | B1 | 9/2003 | Foxall | |
| 7,116,105 | B1 | 10/2006 | Zhang | |
| 8,890,527 | B1 * | 11/2014 | Balcom | G01R 33/5659 324/307 |
| 9,702,946 | B1 * | 7/2017 | Kovtunov | G01R 33/282 |
| 2002/0097049 | A1 * | 7/2002 | Goto | G01R 33/443 324/307 |
| 2002/0149365 | A1 * | 10/2002 | DeMeester | G01R 33/583 324/307 |
| 2003/0160616 | A1 * | 8/2003 | Asano | G01R 33/56518 324/318 |
| 2004/0021464 | A1 | 2/2004 | Fahrig et al. | |
| 2004/0039277 | A1 * | 2/2004 | Watanbe | A61B 5/055 600/410 |
| 2004/0164736 | A1 * | 8/2004 | Guthausen | G01N 24/08 324/307 |
| 2004/0204644 | A1 * | 10/2004 | Tsougarakis | G01R 33/56 600/410 |
| 2005/0168221 | A1 * | 8/2005 | Miyoshi | G01R 33/4828 324/309 |
| 2005/0171422 | A1 * | 8/2005 | Zhang | A61B 5/055 600/410 |
| 2005/0270023 | A1 * | 12/2005 | Freedman | G01V 3/32 324/303 |
| 2006/0164082 | A1 * | 7/2006 | Foxall | G01R 33/3875 324/306 |
| 2007/0182410 | A1 * | 8/2007 | Niemi | G01R 33/5611 324/307 |
| 2008/0111547 | A1 * | 5/2008 | Alsop | G01R 33/5615 324/309 |
| 2010/0019766 | A1 * | 1/2010 | Zuehlsdorff | G01R 33/243 324/314 |
| 2010/0142785 | A1 * | 6/2010 | Dahnke | G01R 33/286 382/131 |
| 2010/0213938 | A1 * | 8/2010 | Jeong | G01R 33/5616 324/309 |
| 2010/0219828 | A1 * | 9/2010 | Takahashi | A61B 5/0555 324/309 |
| 2010/0237861 | A1 * | 9/2010 | Hennel | G01R 33/246 324/307 |
| 2010/0331667 | A1 * | 12/2010 | Nelson | A61B 5/02141 600/411 |
| 2011/0190619 | A1 * | 8/2011 | Good | G01R 33/0354 600/410 |
| 2011/0257512 | A1 * | 10/2011 | Krueger | A61B 18/1492 600/411 |
| 2012/0010497 | A1 | 1/2012 | Ehman et al. | |
| 2012/0081120 | A1 * | 4/2012 | Elgort | G01N 24/006 324/322 |
| 2012/0086453 | A1 * | 4/2012 | Albu | G01N 24/006 324/318 |
| 2012/0119739 | A1 * | 5/2012 | Gleich | A61B 5/05 324/309 |
| 2013/0214783 | A1 * | 8/2013 | Zhao | G01R 33/4828 324/309 |
| 2013/0234706 | A1 * | 9/2013 | Mandal | G01N 24/081 324/303 |
| 2013/0251227 | A1 * | 9/2013 | Wang | G01R 35/00 382/131 |
| 2014/0155732 | A1 * | 6/2014 | Patz | A61B 5/055 600/410 |
| 2014/0203804 | A1 * | 7/2014 | Duensing | G01R 33/3621 324/307 |
| 2014/0210471 | A1 * | 7/2014 | Stemmer | G01R 33/56554 324/309 |
| 2014/0225612 | A1 * | 8/2014 | Polimeni | G01R 33/4835 324/309 |
| 2014/0232400 | A1 * | 8/2014 | Kim | G01N 24/08 324/309 |
| 2014/0266195 | A1 * | 9/2014 | Levin | G01R 33/56509 324/309 |
| 2014/0343397 | A1 * | 11/2014 | Kim | G01R 33/48 600/409 |
| 2015/0115960 | A1 * | 4/2015 | Grodzki | G01R 33/34 324/309 |
| 2016/0192859 | A1 * | 7/2016 | Shirai | A61B 5/0042 600/412 |
| 2017/0003363 | A1 * | 1/2017 | Rosen | G01R 33/445 |

OTHER PUBLICATIONS

International Search Report and Written Opinion dated Feb. 25, 2016 in connection with International Application No. PCT/US2015/060117.

Li et al., Correction of Excitation Profile in Zero Echo Time (ZTE) Imaging Using Quadratic Phase-Modulated RF Pulse Excitation and Iterative Reconstruction. IEEE Trans Med Imaging. Apr. 2014; 33(4):961-9. retrieved on Feb. 10, 2016: http://www.ncbi.nlm.nih.gov/pmc/articles/PMC4136480.

Block et al., Undersampled Radial MRI with Multiple Coils. Iterative Image Reconstruction Using a Total Variation Constraint. Magnetic Resonance in Medicine. 2007;57:1086-98.

Grodzki et al., Quiet T1-weighted head scanning using PETRA. Proc. Intl. Soc. Mag. Reson. Med. 2013;21:0456.

Grodzki, Entwicklung von neuen Sequenzen mit ultrakurzen Echozeiten für die klinische Magnetresonanzbildgebung. 2011. 109 pages.

Haacke et al., Susceptibility-Weighted Imaging: Technical Aspects and Clinical Applications, Part 1. AJNR Am J Neuroradiol. 2009;30:19-30.

Jackson et al., Selection of a Convolution Function for Fourier Inversion Using Gridding. IEEE Transactions on Medical Imaging. 1991;10(3):473-8.

Weiger et al., MRI with Zero Echo Time: Hard Versus Sweep Pulse Excitation. Magnetic Resonance in Medicine. 2011;66:379-89.

Wu et al., Water- and Fat-Suppressed Proton Projection MRI (WASPI) of Rat Femur Bone. Magnetic Resonance in Medicine 2007;57:554-67.

Extended European Search Report for European Application No. 15858711.3 dated Jun. 18, 2018.

Blanco et al., Interventional and intraoperative MRI at low field scanner—a review. European Journal of Radiology, Elsevier Science. 2005;56(2):130-42.

* cited by examiner

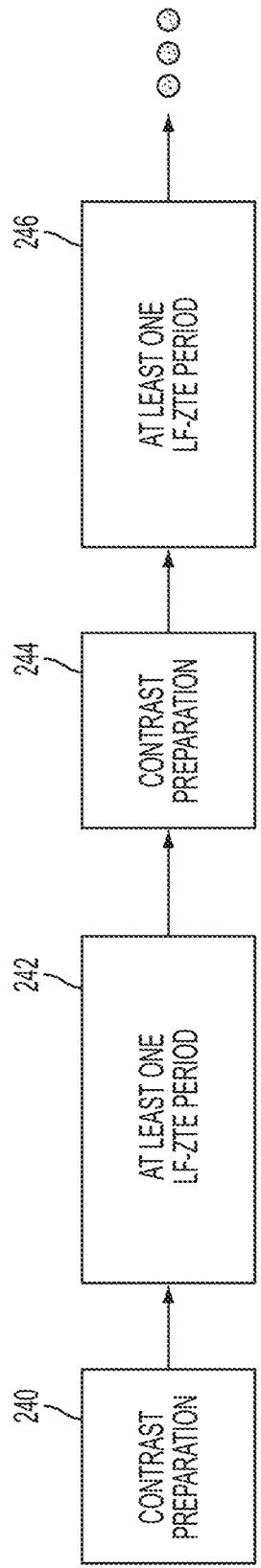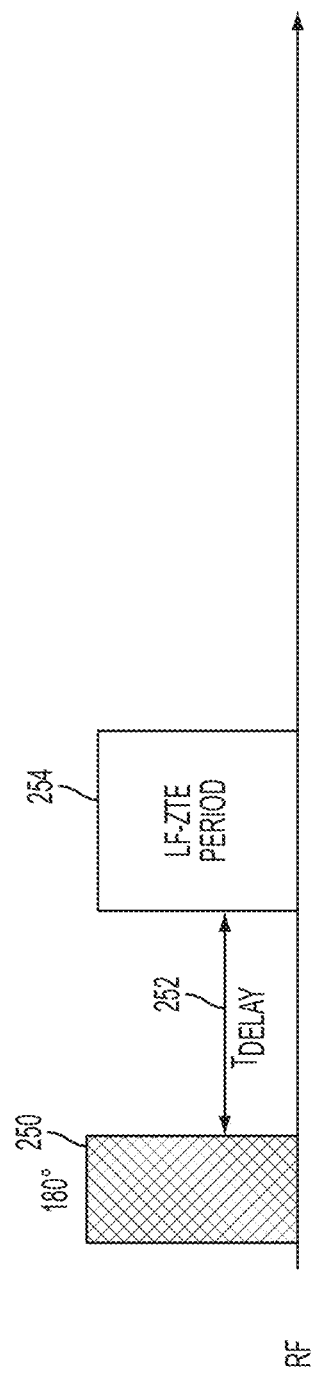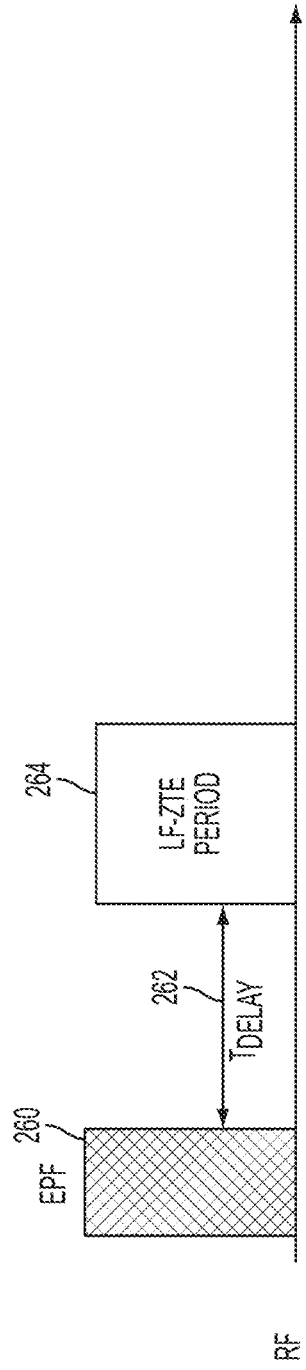

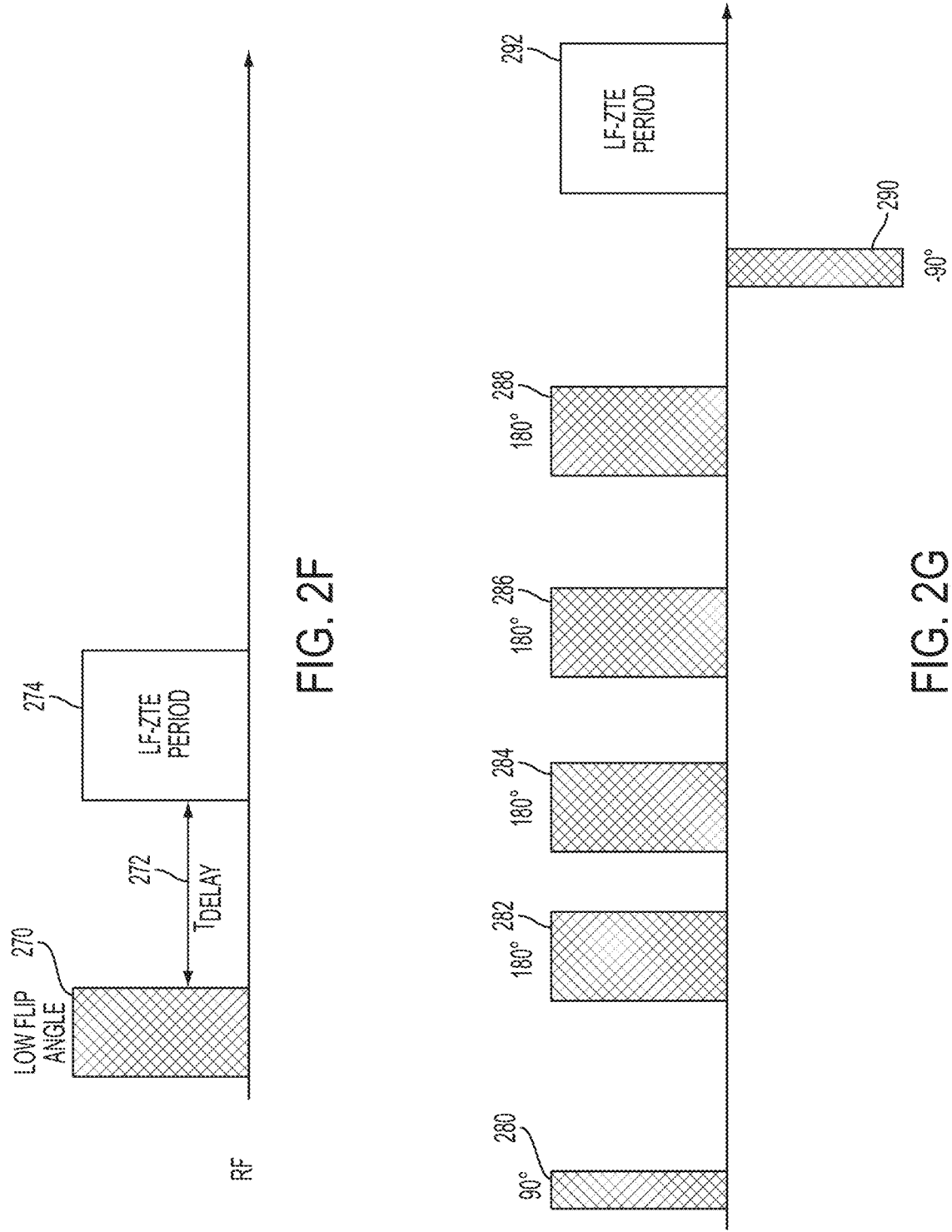

PULSE SEQUENCES FOR LOW FIELD MAGNETIC RESONANCE

CROSS-REFERENCE TO RELATED APPLICATIONS

This application claims priority under 35 U.S.C. § 119(e) to U.S. Provisional Patent Application Ser. No. 62/078,378, filed Nov. 11, 2014 and entitled "Pulse Sequences for Low Field Magnetic Resonance," which is herein incorporated by reference in its entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject being imaged to ionizing radiation, such as x-rays, or introducing radioactive material to the body). Additionally, MRI is capable of capturing information about structures and/or biological processes that other modalities are not well suited to acquire or are incapable of acquiring. For example, MRI is particularly well suited to provide contrast among soft tissues. However, there are a number of drawbacks to conventional MRI techniques that, for a given imaging application, may include the relatively high cost of the equipment, limited availability and/or difficulty in gaining access to clinical MRI scanners, the length of the image acquisition process, etc.

The trend in clinical MRI has been to increase the field strength of MRI scanners to improve one or more of scan time, image resolution, and image contrast, which in turn drives up costs of MRI imaging. The vast majority of installed MRI scanners operate using at least at 1.5 or 3 tesla (T), which refers to the field strength of the main magnetic field $B_0$ of the scanner. A rough cost estimate for a clinical MRI scanner is on the order of one million dollars per tesla, which does not even factor in the substantial operation, service, and maintenance costs involved in operating such MRI scanners.

Additionally, conventional high-field MRI systems typically require large superconducting magnets and associated electronics to generate a strong uniform static magnetic field ($B_0$) in which a subject (e.g., a patient) is imaged. The size of such systems is considerable with a typical MRI installment including multiple rooms for the magnet, electronics, thermal management system, and control console areas. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but is impractical or impossible due to the above-described limitations and as discussed in further detail below.

SUMMARY

The inventors have appreciated that performing low-field magnetic resonance imaging can be facilitated via the use of pulse sequences developed by the inventors to operate in the low-field context.

Some embodiments provide for a low-field magnetic resonance imaging (MRI) system, comprising a plurality of magnetics components comprising at least one first magnetics component configured to produce a low-field main magnetic field $B_0$ and at least one second magnetics component configured to acquire magnetic resonance data when operated; and at least one controller configured to operate one or more of the plurality of magnetics components in accordance with at least one low-field zero echo time (LF-ZTE) pulse sequence.

Some embodiments provide for a method for operating a low-field magnetic resonance imaging system, the system comprising a plurality of magnetics components, the plurality of magnetics components comprising at least one first magnetics component configured to produce a low-field main magnetic field $B_0$ and at least one second magnetics component configured to acquire magnetic resonance data when operated. The method comprises using the at least one first magnetics component to produce the low-field main magnetic field $B_0$; and controlling, using at least one controller, one or more of the plurality of magnetics components in accordance with at least one low-field zero echo time (LF-ZTE) pulse sequence.

Some embodiments provide for at least one non-transitory computer readable storage medium storing processor executable instructions that, when executed by a low-field MRI system comprising a plurality of magnetics components, the plurality of magnetics components comprising at least one first magnetics component configured to produce a low-field main magnetic field $B_0$ and at least one second magnetics component configured to acquire magnetic resonance data when operated, allow the low-field MRI system to: use the at least one first magnetics component to produce the low-field main magnetic field $B_0$; and operate one or more of the plurality of magnetics components in accordance with at least one low-field zero echo time (LF-ZTE) pulse sequence.

Some embodiments provide for a low-field magnetic resonance imaging (MRI) system, comprising: a plurality of magnetics components comprising at least one first magnetics component configured to produce a low-field main magnetic field $B_0$ and at least one second magnetics component configured to acquire magnetic resonance data when operated; and at least one controller configured to operate one or more of the plurality of magnetics components in accordance with at least one low-field refocusing (LFR) pulse sequence, wherein the RF excitation pulses in the at least one LFR pulse sequence are associated with a flip angle that reduces effect of $B_0$ inhomogeneities on net transverse magnetization.

Some embodiments provide for a method for operating a low-field magnetic resonance imaging system, the system comprising a plurality of magnetics components, the plurality of magnetics components comprising at least one first magnetics component configured to produce a low-field main magnetic field $B_0$ and at least one second magnetics component configured to acquire magnetic resonance data when operated. The method comprises operating the at least one first magnetics component to produce the low-field main magnetic field $B_0$; and controlling, using at least one controller, one or more of the plurality of magnetics components in accordance with at least one low-field refocusing (LFR) pulse sequence, wherein the RF excitation pulses in the at least one LFR pulse sequence are associated with a flip angle that reduces effect of $B_0$ inhomogeneities on net transverse magnetization.

Some embodiments provide for at least one non-transitory computer readable storage medium storing processor executable instructions that, when executed by a low-field MRI system comprising a plurality of magnetics components, the plurality of magnetics components comprising at least one first magnetics component configured to produce a low-field main magnetic field $B_0$ and at least one second magnetics component configured to acquire magnetic resonance data when operated, allow the low-field MRI system to: operate the at least one first magnetics component to produce the low-field main magnetic field $B_0$; and operate one or more of the plurality of magnetics components in accordance with at least one low-field refocusing (LFR) pulse sequence, wherein the RF excitation pulses in the at least one LFR pulse sequence are associated with a flip angle that reduces effect of $B_0$ inhomogeneities on net transverse magnetization.

Some embodiments provide for a low-field magnetic resonance imaging (MRI) system, comprising: a plurality of magnetics components configured to produce a plurality of magnetic fields including a low-field main magnetic field $B_0$, the plurality of magnetics components comprising at least one first magnetics component configured to produce the low-field main magnetic field $B_0$ and at least one second magnetics component configured to acquire magnetic resonance data when operated; and at least one controller configured to operate one or more of the plurality of magnetics components in accordance with a pulse sequence designed to compensate for inhomogeneity in one or more of the plurality of magnetic fields at least in part by causing one or more of the plurality of magnetics components to apply a series of RF pulses having at least one parameter that varies during a respective series of pulse repetition periods of the pulse sequence.

Some embodiments provide for a method for operating a low-field magnetic resonance imaging system, the system comprising a plurality of magnetics components configured to produce a plurality of magnetic fields including a low-field main magnetic field $B_0$, the plurality of magnetics components comprising at least one first magnetics component configured to produce the low-field main magnetic field $B_0$ and at least one second magnetics component configured to acquire magnetic resonance data when operated. The method comprises operating the at least one first magnetics component to produce the low-field main magnetic field $B_0$; and controlling, using at least one controller, one or more of the plurality of magnetics components in accordance with a pulse sequence designed to compensate for inhomogeneity in one or more of the plurality of magnetic fields at least in part by causing the plurality of magnetics components to apply a series of RF pulses having at least one parameter that varies during a respective series of pulse repetition periods of the pulse sequence.

Some embodiments provide for at least one non-transitory computer readable storage medium storing processor executable instructions that, when executed by a low-field MRI system having a plurality of magnetics components configured to produce a plurality of magnetic fields including a low-field main magnetic field $B_0$, the plurality of magnetics components comprising at least one first magnetics component configured to produce the low-field main magnetic field $B_0$ and at least one second magnetics component configured to acquire magnetic resonance data when operated generate at least one magnetic field, allow the low-field MRI system to: operate the at least one first magnetics component to produce the low-field main magnetic field $B_0$; and operate one or more of the plurality of magnetics components in accordance with a pulse sequence designed to compensate for inhomogeneity in one or more of the plurality of magnetic fields at least in part by causing the plurality of magnetics components to apply a series of RF pulses having at least one parameter that varies during a respective series of pulse repetition periods of the pulse sequence.

BRIEF DESCRIPTION OF THE DRAWINGS

Various aspects and embodiments of the disclosed technology will be described with reference to the following figures. It should be appreciated that the figures are not necessarily drawn to scale. Items appearing in multiple figures are indicated by the same reference number in all the figures in which they appear.

FIG. 2C is a diagram illustrating an LF-ZTE pulse sequence comprising one or more contrast preparation portions, in accordance with some embodiments of the technology described herein.

FIG. 2D is a diagram illustrating a portion of an LF-ZTE pulse sequence comprising a T1 contrast preparation portion, in accordance with some embodiments of the technology described herein.

FIG. 2E is a diagram illustrating a portion of an LF-ZTE pulse sequence comprising an electron paramagnetic resonance (EPR) pulse sequence, in accordance with some embodiments of the technology described herein.

FIG. 2F is a diagram illustrating a portion of an LF-ZTE pulse sequence comprising a navigation pulse sequence, in accordance with some embodiments of the technology described herein.

FIG. 2G is a diagram illustrating a portion of an LF-ZTE pulse sequence comprising a water/fat separation contrast preparation sequence, in accordance with some embodiments of the technology described herein.

DETAILED DESCRIPTION

Figure 1:
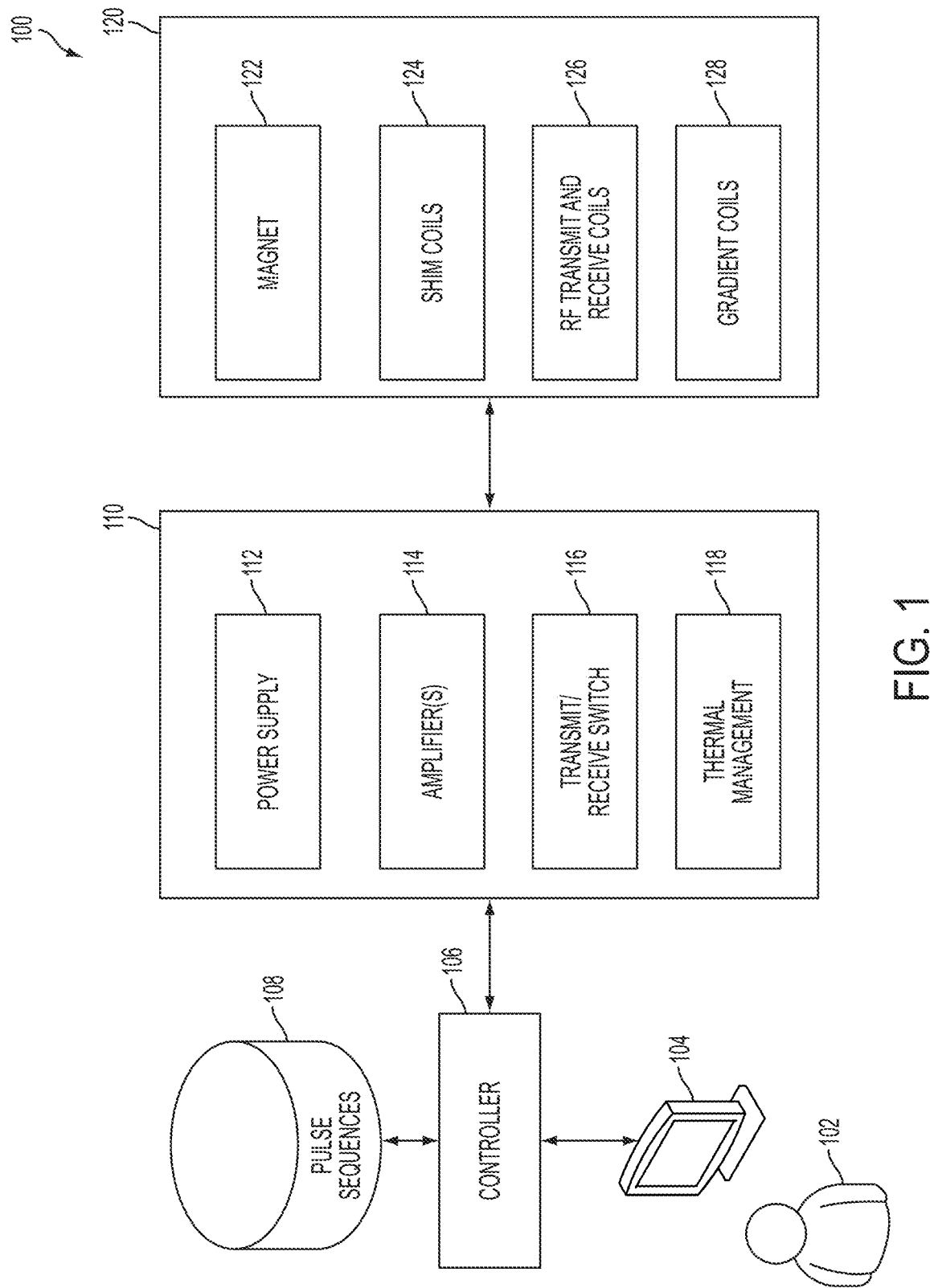
FIG. 1 is a block diagram of exemplary components of a low-field MRI system, in accordance with some embodiments of the technology described herein.

The MRI scanner market is overwhelmingly dominated by high-field systems, and is exclusively so for medical or clinical MRI applications. As used herein, "high-field" refers generally to MRI systems presently in use in a clinical setting and, more particularly, to MRI systems operating with a main magnetic field (i.e., a B0 field) at or above 1.5 T, though clinical systems operating between 0.5 T and 1.5 T are typically also considered "high-field." By contrast, "low-field" refers generally to MRI systems operating with a B0 field of less than or equal to approximately 0.2 T.

The appeal of high-field MRI systems includes improved resolution and/or reduced scan times relative to lower field systems, motivating the push for higher and higher field strengths for use in clinical and medical MRI applications. As discussed above, however, increasing the field strength of MRI systems increases the cost and complexity of MRI scanners, thus limiting their availability and preventing their use as a general-purpose and/or generally-available imaging solution.

Low-field MR has been explored in limited contexts for non-imaging research purposes and narrow and specific contrast-enhanced imaging applications, but is conventionally regarded as being unsuitable for producing clinically useful images. For example, the resolution, contrast, and/or image acquisition time is generally not regarded as being suitable for clinical purposes including, but not limited to, tissue differentiation, blood flow or perfusion imaging, diffusion-weighted (DW) or diffusion tensor (DT) imaging, functional MRI (fMRI), etc. At least some of the difficulty in obtaining clinically useful images using low-field MRI relates to the fact that, generally speaking, pulse sequences designed for high-field MRI are unsuitable in a low-field environment for reasons discussed in further detail below.

Briefly, MRI involves placing a subject to be imaged (e.g., all or a portion of a patient) in a static, homogenous magnetic field $B_0$ to align a subject's atomic net magnetization (often represented by a net magnetization vector) in the direction of the $B_0$ field. One or more transmit coils are then used to generate a pulsed magnetic field $B_1$ having a frequency related to the rate of precession of atomic spins of the atoms in the magnetic field $B_0$ to cause the net magnetization of the atoms to develop a component in a direction transverse to the direction of the $B_0$ field. After the $B_1$ field is turned off, the transverse component of the net magnetization vector precesses, its magnitude decaying over time until the net magnetization re-aligns with the direction of the $B_0$ field. This process produces MR signals that can be detected by voltages induced in one or more receive coils of the MRI system.

In addition, MRI involves using gradient coils to induce gradients in the main magnetic field $B_0$ so that the MR signal emanating from particular spatial locations within the subject may be identified (i.e., gradient coils are used to spatially encode detected MR signals). An MR image is formed in part by pulsing the transmit coil(s) and/or the gradient coils in a particular sequence, referred to as a "pulse sequence," and using the receive coil(s) to sense MR signals induced by the pulse sequence. The detected MR signals may then be processed (e.g., "reconstructed") to form an image. A pulse sequence generally describes the order and timing in which transmit/receive coils and gradient coils operate to prepare the magnetization of the subject and acquire resulting MR data. For example, a pulse sequence may indicate an order of transmit pulses, gradient pulses, and acquisition times during which the receive coils acquire MR data.

While a number of pulse sequences have been developed for high-field MRI, pulse sequences defined for high-field MRI are unsuitable for application in a low-field environment. The significant differences in the operating parameters of high-field and low-field MRI and, in particular, the substantial reduction in signal-to-noise ratio (SNR) requires a different approach to the design of pulse sequences suitable for low-field MRI. The inventors have developed pulse sequences designed specifically for low-field MRI that address various drawbacks of the low-field environment and that take advantage of others to reduce acquisition time and improve the quality of low-field MRI. The significant differences in the operating parameters of conventional high-field MRI pulse sequences and low-field MRI pulse sequences developed by the inventors are illustrated in Tables 1 and 2 below. In addition, the inventors have developed pulse sequences for low-field MRI for different contrast types such as $T_1$-weighted and $T_2$-weighted imaging, diffusion-weighted imaging, arterial spin labeling (perfusion imaging), Overhauser imaging, etc., each of which have a particular set of considerations in the low-field context.

The signal to noise ratio of the MR signal is related to the strength of the main magnetic field $B_0$, and is one of the primary factors driving clinical systems to operate in the high-field regime. As such, the MR signal strength in low-field is small relatively speaking, making the design of pulse sequences critical. The inventors have developed pulse sequences that increase the SNR and/or decrease the time for MR data acquisition to facilitate improved low-field MRI (e.g., by improving resolution, enabling satisfactory acquisition times, etc.), as discussed in further detail below.

As discussed above, the small SNR of low-field MRI is a significant challenge in performing low-field MRI. A technique for addressing the low SNR is to repeat MR data acquisition for a particular spatial encoding multiple times (e.g., by repeating a pulse sequence with the same or similar operating parameters) and averaging the obtained MR signal that results. However, while averaging improves SNR, the repeat acquisitions increase total acquisition times. To address this issue, the inventors have developed a number of "rapid averaging" pulse sequences that employ averaging to increase the signal to noise ratio of the acquired MR signal, but allow for such averaging to be performed rapidly thereby reducing the overall amount of time to acquire an image. Such rapid averaging pulse sequences result in improved MR imaging in low-SNR (e.g., low-field) environments. The term "average" is used herein to describe any type of scheme for combining the signals, including absolute average (e.g., mean), weighted average, or any other technique that can be used to increase the SNR by combining MR data from multiple acquisitions.

The inventors have recognized that a suitable class of rapid averaging pulse sequences includes zero echo time pulse sequences. The inventors have developed pulse sequences, referred to herein as low-field zero echo time (LF-ZTE) pulse sequences, that are specifically designed for use and/or optimal performance in the low-field context. LF-ZTE pulse sequences may comprise RF pulses that induce relatively small flip angles (e.g., flip angles between fifteen and fifty degrees) which allows for faster averaging of multiple acquisitions by virtue of the corresponding shorter relaxation times and, therefore, less time between successive acquisitions. In turn, quicker individual acquisitions allow for multiple acquisitions to be averaged rapidly. In addition, as described in more detail below, LF-ZTE pulse sequences allow the receive coil(s) to operate and receive MR signals for longer periods within the pulse sequence to increase the amount of signal obtained to increase the SNR of the acquisition. Consequently, fewer repetitions over which the MR signal is averaged are needed to attain a desired SNR. Accordingly, in some embodiments, a low-field MRI system may comprise one or more components (e.g., one or more transmit coils, one or more receive coils, one or more gradient coils, etc.) configured to operate in accordance with one or more LF-ZTE pulse sequences, as discussed in further detail below.

Another type of rapid averaging pulse sequence developed by the inventors and specifically designed for use and/or optimal performance in the low-field context is a low-field refocusing (LFR) pulse sequence. Refocusing pulse sequences are characterized by having a portion of the pulse sequence configured to refocus the magnetization to a known state. For example, an LFR pulse sequence may comprise at least one RF pulse that induces a large flip angle of the net magnetization vector (e.g., a flip angles larger than 30 degrees, and more preferably approximately 70 degrees or more) and a refocusing phase, after a period of relaxation during which acquisition occurs, that drives the net magnetization vector toward that same large flip angle. A refocusing stage may comprise applying gradient fields having strengths and polarities such that the sum of the field strengths of each gradient field across the duration of a pulse repetition period is substantially zero (or intended to be near zero). For example, gradient fields applied during the refocusing phase may be equal and opposite to the gradient fields applied during an encoding phase of a pulse repetition period. Such sequences are referred to as "balanced."

LFR pulse sequences do not require waiting for the net magnetization to realign with the $B_0$ field between successive MR data acquisitions (e.g., successive acquisitions may be obtained without needing to wait for the transverse magnetization vector to decrease to 0). In this way, successive acquisitions may be performed more rapidly which, in turn, allows for rapid averaging of multiple acquisitions to the extent that such averaging is performed. Some embodiments include balanced pulse sequences developed by the inventors for use in the low field context, referred to herein as low-field balanced steady state free precession (LF-bSSFP) pulse sequences, some examples of which are described in more detail below. Accordingly, in some embodiments, a low-field MRI system may comprise one or more components (e.g., a control component configured to drive one or more transmit coils, one or more receive coils, one or more gradient coils, etc.) configured to operate in accordance with one or more LFR (e.g., LF-bSFFP) pulse sequences, as discussed in further detail below.

Generally, in the application of a pulse sequence, there is a time delay between the time the transmit coil(s) stop transmitting an RF excitation pulse and the time that the receive coil(s) are capable of accurately detecting MR signals from the subject. This time delay is due significantly to the so-called "ringing" of the transmit coil, whereby the coil absorbs energy from the transmitted RF pulse and subsequently "rings" due to coil coupling (e.g., as absorbed energy dissipates at the coil's resonant frequency). Until coil ringing sufficiently attenuates (this period may be termed the "ring-down" period), the receive coil (which, in some embodiments, may be the same coil as the receive coil) cannot be used to detect the MR signal.

The inventors have recognized that the RF pulses emitted by the transmit coil may be designed to reduce the coil ringing effect by shortening the ring-down period, thereby increasing the acquisition time in a pulse sequence used (e.g., an LF-ZTE pulse sequence) which, in turn, increases the SNR of the MR signal. Accordingly, in some embodiments, a low-field MRI system may be configured to operate using RF pulses designed to reduce the length of the ring-down period. For example, the RF pulses may be shaped to counteract the attenuation induced to the RF pulse by the transmit coil by pre-emphasizing the RF pulse in proportion to the inverse of the transmit coil's transfer function. This is described in more detail below with reference to FIGS. 7-11.

Additionally or alternatively, the ring-down period may be shortened by introducing a damping circuit designed to dampen the energy absorbed by the transmit coil from the transmitted RF pulse in series or in parallel with the transmit coil. The damping circuit may be switched on for a period of time after the transmit coil finishes transmitting in order to perform the damping and, subsequently, may be switched off before the transmit coil begins to transmit again. The damping circuit may be designed in a variety of ways. In some embodiments, for example, the damping circuit may include an n-channel metal oxide semiconductor field-effect transistor (nMOS FET) having its source terminal tied to the gnd terminal, the drain terminal tied to the signal after the tuner from the transmit coil, and the gate terminal tied to a fast digital input/output line. In some instances, the damping circuit may also include a low value resistor in series with the drain and signal line. Such a damping circuit can be used to short out the ring down by dumping its energy quickly into the nMOS FET and/or resistor.

Conventional high-field MRI systems generate an oscillating $B_1$ field using RF pulses where the carrier frequency of each RF pulse is designed to be constant over its duration. The inventors have recognized that an improved low-field MRI system may be obtained by generating an oscillating $B_1$ field using frequency-modulated RF pulses where the carrier frequency of each RF pulse changes in time over its duration. Examples of frequency-modulated RF pulses include linear frequency modulated pulses and adiabatic RF pulses. The carrier frequency of an adiabatic pulse may vary (e.g., in response being modulated) in accordance with a quadratic or a geometric function. An MRI system that uses frequency-modulated RF pulses to generate a $B_1$ field is less sensitive to inhomogeneities in the main magnetic field $B_0$ and in the $B_1$ field than an MRI system that uses RF pulses having a constant carrier frequency. However, frequency-modulated RF pulses are not used in conventional high-field clinical MRI systems because they are longer in duration and have higher power than constant frequency pulses such that the use of frequency-modulated pulses would result in impermissible heating of tissue of a subject (i.e., typically results in exceeding the specific absorption rate (SAR) allowed by regulations).

The inventors have recognized that frequency-modulated low-field pulses may be used for low-field MRI because, at low-field, the power levels of such pulses can be reduced to remain below acceptable or required SAR limits. Accordingly, in some embodiments, a low-field MRI system may be configured to generate an oscillating B1 field using frequency-modulated RF pulses which may reduce the sensitivity of the low-field MRI system to inhomogeneities in the main magnetic $B_0$ field and in the $B_1$ field. In this way, the quality of images obtained by a low-field MRI system may be improved because of the increased insensitivity to $B_0$ field inhomogeneity.

The inventors have further appreciated that LF-ZTE sequences may be suitable in the context of Overhauser-enhanced MRI (OMRI). According to some embodiments, a low-field MRI system may be configured to operate using an LF-ZTE pulse sequence having one or more contrast preparation portions. For example, in some embodiments, a low-field MRI system may use an LF-ZTE pulse sequence comprising one or more electron paramagnetic resonance (EPR) pulses to generate OMRI images, which provides a mechanism for imaging free radicals to provide, for example, detection of brain trauma. As another example, in some embodiments, a low-field MRI system may use an LF-ZTE pulse sequence may comprise one or more portions to prepare the subject for water/fat contrast imaging. In yet other embodiments, a low-field MRI system may use an LF-ZTE pulse sequence comprising one or more T1 contrast preparation portions, one or more T2 contrast preparation portions, one or more arterial spin labelling contrast preparation portions and/or one or more diffusion weighted contrast preparation portions.

As discussed above, a benefit of low-field MRI is that it facilitates deployment of a relatively low cost MRI system that can be installed and maintained at virtually any location and/or may be designed to be portable/cartable to increase the availability of the systems, from both a cost and accessibility standpoint. As a result, such low-field MRI systems may operate in less regulated environments from a noise perspective and/or may operate in changing environments for portable/cartable systems. The inventors have recognized the benefit of "environmentally-informed" or adaptive pulse sequences configured to dynamically change based on the environment in which a given low-field MRI system is operating. For example, one or more parameters of a pulse sequence may be dynamically varied based on one or more measurements obtained from the environment (e.g., measurements by one or more field sensors), measurements of the MRI system (e.g., measurements of the magnetic fields generated, temperature measurements, etc.) and/or measurements of the subject being scanned (e.g., patient motion, etc.). It should be appreciated that any of the low-field pulse sequences described herein may be configured to be environmentally informed by allowing one or more parameters of the pulse sequence to vary based on one or more measurements of the environment and/or system.

According to some embodiments, a low field MRI system (e.g., a portable low-field MRI system) may be employed in a "noisy" environment (e.g., in an environment with interference, such as electro-magnetic interference, that would at least partially interfere with operation of the low field MRI system) and a pulse sequence may be selected and/or adapted (e.g., parameters of the pulse sequence may be modified) based on the nature of the noise in the environment. As another example, a low field MRI system may be employed to image a subject that is moving during the course of image acquisition, and a pulse sequence may be selected and/or adapted to reduce the impact of the subject's motion during acquisition (e.g., by using a pulse sequence that has as short an acquisition period as possible). As another example, one or more components of a low field MRI system may move relative to the subject during acquisition, and a pulse sequence may be selected and/or adapted to reduce the impact of the motion of the MRI system component(s).

It should be appreciated that the embodiments described herein may be implemented in any of numerous ways. Examples of specific implementations are provided below for illustrative purposes only. It should be appreciated that the embodiments and the features/capabilities provided may be used individually, all together, or in any combination of two or more, as aspects of the technology described herein are not limited in this respect.

FIG. 1 is a block diagram of exemplary components of a MRI system 100. In the illustrative example of FIG. 1, MRI system 100 comprises computing device 104, controller 106, pulse sequences store 108, power management system 110, and magnetics components 120. It should be appreciated that system 100 is illustrative and that a low-field MRI system may have one or more other components of any suitable type in addition to or instead of the components illustrated in FIG. 1.

As illustrated in FIG. 1, magnetics components 120 comprises $B_0$ magnet 122, shim coils 124, RF transmit and receive coils 126, and gradient coils 128. $B_0$ magnet 122 may be used to generate, at least in part, the main magnetic field $B_0$. $B_0$ magnet 122 may be any suitable type of magnet that can generate a main magnetic field (e.g., a low-field strength of approximately 0.2 T or less), and may include one or more $B_0$ coils, correction coils, etc. Shim coils 124 may be used to contribute magnetic field(s) to improve the homogeneity of the $B_0$ field generated by magnet 122. Gradient coils 128 may be arranged to provide gradient fields and, for example, may be arranged to generate gradients in the magnetic field in three substantially orthogonal directions (X, Y, Z) to localize where MR signals are induced.

RF transmit and receive coils 126 may comprise one or more transmit coils that may be used to generate RF pulses to induce a magnetic field $B_1$. The transmit/receive coil(s) may be configured to generate any suitable type of RF pulses configured to excite an MR response in a subject and detect the resulting MR signals emitted. RF transmit and receive coils 126 may include one or multiple transmit coils and one or multiple receive coils. The configuration of the transmit/receive coils varies with implementation and may include a single coil for both transmitting and receiving, separate coils for transmitting and receiving, multiple coils for transmitting and/or receiving, or any combination to achieve single channel or parallel MRI systems. Thus, the transmit/receive magnetics component is often referred to as Tx/Rx or Tx/Rx coils to generically refer to the various configurations for the transmit and receive component of an MRI system. Each of magnetics components 120 may be constructed in any suitable way. For example, in some embodiments, one or more of magnetics components 120 may be any of the components described in U.S. patent application Ser. No. 14/845,652 ('652 application), filed Sep. 4, 2015 and titled "Low Field Magnetic Resonance Imaging Methods and Apparatus," which is herein incorporated by reference in its entirety.

The transmit coil(s) may be configured to generate any suitable types of RF pulses. For example, the transmit coil(s) may be configured to generate one or more RF pulses each having a constant carrier frequency over its duration. As another example, the transmit coil(s) may be configured to generate one or more frequency-modulated RF pulses (e.g., linear frequency modulated RF pulses, adiabatic RF pulses, etc.) whereby the carrier frequency of a frequency modulated pulse changes over the course of its duration. As yet another example, the transmit coil(s) may be configured to generate one or more electron paramagnetic resonance pulses. As yet another example, the transmit coil(s) may be used to generate RF pulses designed to reduce the effect of coil ringing.

Power management system 110 includes electronics to provide operating power to one or more components of the low-field MRI system 100. For example, as discussed in more detail below, power management system 110 may include one or more power supplies, gradient power amplifiers, transmit coil amplifiers, and/or any other suitable power electronics needed to provide suitable operating power to energize and operate components of the low-field MRI system 100.

As illustrated in FIG. 1, power management system 110 comprises power supply 112, amplifier(s) 114, transmit/receive switch 116, and thermal management components 118. Power supply 112 includes electronics to provide operating power to magnetics components 120 of the low-field MRI system 100. For example, power supply 112 may include electronics to provide operating power to one or more $B_0$ coils (e.g., $B_0$ magnet 122) to produce the main magnetic field for the low-field MRI system. In some embodiments, power supply 112 is a unipolar, continuous wave (CW) power supply, however, any suitable power supply may be used. Transmit/receive switch 116 may be used to select whether RF transmit coils or RF receive coils are being operated.

Amplifier(s) 114 may include one or more RF receive (Rx) pre-amplifiers that amplify MR signals detected by one or more RF receive coils (e.g., coils 124), one or more RF transmit (Tx) amplifiers configured to provide power to one or more RF transmit coils (e.g., coils 126), one or more gradient power amplifiers configured to provide power to one or more gradient coils (e.g., gradient coils 128), shim amplifiers configured to provide power to one or more shim coils (e.g., shim coils 124).

Thermal management components 118 provide cooling for components of low-field MRI system 100 and may be configured to do so by facilitating the transfer of thermal energy generated by one or more components of the low-field MRI system 100 away from those components. Thermal management components 118 may include, without limitation, components to perform water-based or air-based cooling, which may be integrated with or arranged in close proximity to MRI components that generate heat including, but not limited to, $B_0$ coils, gradient coils, shim coils, and/or transmit/receive coils. Thermal management components 118 may include any suitable heat transfer medium including, but not limited to, air and water, to transfer heat away from components of the low-field MRI system 100.

As illustrated in FIG. 1, low-field MRI system 100 includes controller 106 (sometimes referred to as a console in the MRI context) configured to send instructions to and receive information from power management system 110. Controller 106 may be configured to implement one or more pulse sequences, which are used to determine the instructions sent to power management system 110 to operate the magnetics components 120 in a desired sequence, for example, by operating the transmit coil(s) and/or the gradient coils in the particular sequence defined by the pulse sequence. A pulse sequence generally describes the order and timing in which transmit/receive coils and gradient coils operate to prepare the magnetization of the subject and acquire resulting MR data. For example, a pulse sequence may indicate an order of transmit pulses, gradient pulses, and acquisition times during which the receive coils acquire MR data, as discussed in further detail below.

Controller 106 may be configured to control power management system 110 to operate the magnetics components 120 in accordance with an LF-ZTE pulse sequence, a low-field balance steady-state free precession (LF-bSSFP) pulse sequence, a low-field gradient echo pulse sequence, a low-field spin echo pulse sequence, a low-field inversion recovery pulse sequence, arterial spin labeling, diffusion weighted imaging (DWI), and/or any other suitable pulse sequence. Pulse sequences for low-field MRI may be applied for different contrast types such as T1-weighted and T2-weighted imaging, diffusion-weighted imaging, arterial spin labeling (perfusion imaging), Overhauser imaging, etc., each of which have a particular set of considerations in the low-field context. Controller 106 may be implemented as hardware, software, or any suitable combination of hardware and software, as aspects of the disclosure provided herein are not limited in this respect.

In some embodiments, controller 106 may be configured to implement a pulse sequence by obtaining information about the pulse sequence from pulse sequences repository 108, which stores information for each of one or more pulse sequences. Information stored by pulse sequences repository 108 for a particular pulse sequence may be any suitable information that allows controller 106 to implement the particular pulse sequence. For example, information stored in pulse sequences repository 108 for a pulse sequence may include one or more parameters for operating magnetics components 120 in accordance with the pulse sequence (e.g., parameters for operating the RF transmit and receive coils 126, parameters for operating gradient coils 128, etc.), one or more parameters for operating power management system 110 in accordance with the pulse sequence, one or more programs comprising instructions that, when executed by controller 106, cause controller 106 to control system 100 to operate in accordance with the pulse sequence, and/or any other suitable information. Information stored in pulse sequences repository 108 may be stored on one or more non-transitory storage media.

As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

Computing device 104 may be any electronic device, and typically includes one or more processors configured (e.g., programmed) to process acquired MR data and generate one or more images of the subject being imaged. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged.

It should be appreciated that controller 106 may be a single integrated controller or may comprise separate controllers to perform functions of system 100. In some embodiments, computing device 104 may comprise multiple computing devices of any suitable type, as the aspects are not limited in this respect. A user 102 may interact with computing device 104 (e.g., a workstation) to control aspects of the low-field MR system 100 (e.g., program system 100 to operate in accordance with a particular pulse sequence, adjust one or more parameters of the system 100, etc.) and/or view images obtained by the low-field MR system 100. According to some embodiments, computing device 104 and controller 106 form a single controller, while in other embodiments, computing device 104 and controller 106 each comprise one or more controllers. It should be appreciated that the functionality performed by computing device 104 and controller 106 may be distributed in any way over any combination of one or more controllers, as the aspects are not limited for use with any particular implementation or architecture. Controller 106 and computing device 104 typically comprise one or more processors capable of executing instructions embodied in computer code, such as software programs, firmware instructions, etc. to perform one or more functions in connection with the operation of system 100.

As described above, the inventors have recognized that it may be advantageous to operate a low-field MRI system, such as the low-field MRI system 100 described above, in accordance with an LF-ZTE pulse sequence. Aspects of LF-ZTE pulse sequences in accordance with some embodiments are described in more detail below with reference to FIGS. 2A-2G and 3.

Figure 2A:
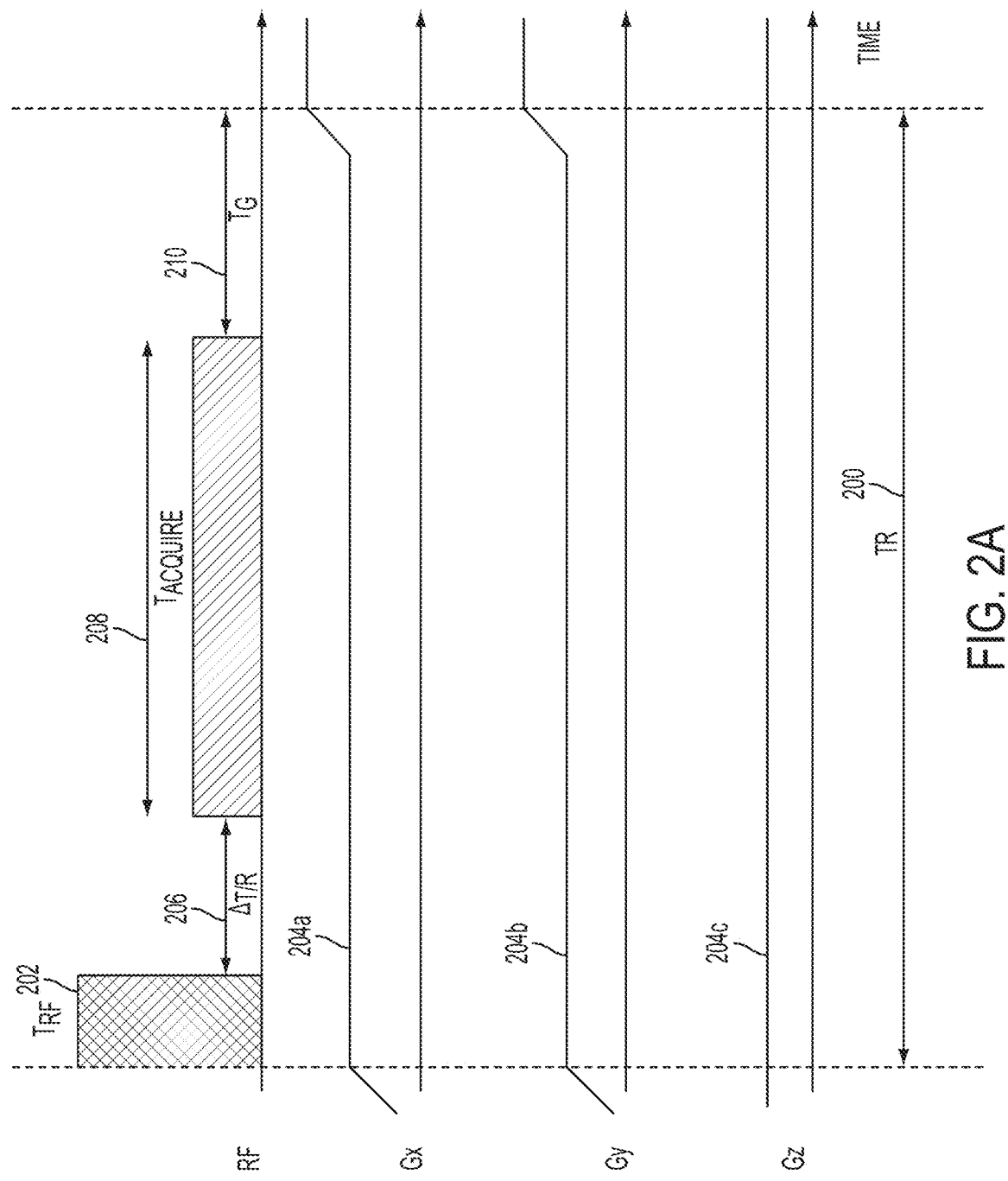
FIG. 2A is a diagram illustrating one pulse repetition period of a low field zero echo time pulse sequence, in accordance with some embodiments of the technology described herein.

FIG. 2A is a diagram illustrating one pulse repetition period 200 having duration $T_R$ of an LF-ZTE pulse sequence, in accordance with some embodiments of the technology described herein. Initially, an RF pulse 202 of duration $T_F$ is applied at the same time as the gradient coils are generating gradient fields $G_x$, $G_y$, and $G_z$ at respective operating strengths of 204a, 204b, and 204c. The gradient fields $G_x$, $G_y$, and $G_z$ are applied in substantially orthogonal directions. Next, after a delay 206 of duration $\Delta_{T/R}$ that allows the system to switch from transmit mode to receive mode, the receiving coils are operated to acquire the MR data during acquisition interval 208 of duration $T_{ACQUIRE}$. During the subsequent interval 210 of duration $T_G$ (e.g., towards or at the tail end of the interval 210), the strength of one or more gradient fields is changed to one or more other values. As illustrated in FIG. 2A, the strengths of fields $G_x$ and $G_y$ are changed during interval 210, but the strength of the field $G_z$ is unchanged during interval 210. The duration of an LF-ZTE pulse repetition may be 1-25 milliseconds, in some embodiments.

Although in the embodiment illustrated in FIG. 2A the gradient field strengths 204a, 204b, and 204c are shown as being constant through the pulse repetition period 200 (with the exception of the tail end of interval 210 when the strengths are shown to be changing to another constant value), in other embodiments, the strengths of the gradient fields $G_x$, $G_y$, and $G_z$ may vary during the pulse repetition period. For example, the strengths of one or more of the gradient fields may be modulated within a pulse repetition period to compensate for the presence of time-varying eddy current fields. As another example, the strengths of one or more of the gradient fields may be modulated within a pulse repetition period to improve spatial encoding efficiency. As yet another example, lowering the strengths of one or more of the gradient fields during the transmission of the RF pulse allows a lower-bandwidth pulse to be used in order to excite MR signal over the same area of the target (e.g., slice). Accordingly, in some embodiments, the strengths of one or more of the gradient fields may be reduced during transmission of the RF pulse 202.

As can be seen from FIG. 2A, the gradient coils are operating throughout the entire duration of pulse repetition period 200, without being turned on and off, as the case may be with other sequences. Incrementally changing the strength of the gradient fields produced by the gradient coils may be less taxing on various components of an MRI system (e.g., a low-field MRI system) such as power amplifiers, for example, which do not have to drive rapid and large current changes. It can also be observed that the pulse repetition time $T_R$ is the sum of the duration of the RF pulse $T_F$, the duration $\Delta_{T/R}$ of transmit/receive delay 206, the duration $T_{ACQUIRE}$ of the acquisition period 208, and the duration $T_G$ of the gradient switching interval. That is, $$T_R = T_F + \Delta_{T/R} + T_{ACQUIRE} + T_G.$$

The RF pulse 202 may induce a flip-angle of any suitable degree. For example, RF pulse 202 may induce a flip angle between 15 and 50 degrees and, in some instances, a flip angle of 90 degrees or less. In some embodiments, RF pulse 202 may induce a small flip angle so as to minimize the time required for relaxation before another RF pulse may be applied in the next pulse repetition period. For example, an RF pulse may be used to induce a flip angle smaller than 60 degrees. As another example, an RF pulse may be used to induce a flip angle smaller than 40 degrees. As yet another example, an RF pulse may be used to induce a flip angle smaller than 20 degrees. As yet another example, an RF pulse may be used to induce a flip angle smaller than 15 degrees. As discussed above, using a low flip angle may be advantageous in low-SNR environments because it allows for efficient averaging of multiple acquisitions: lower flip angles result in faster relaxation times and, consequently, faster averaging of multiple acquisitions.

The RF pulse 202 may be any suitable type of RF pulse. For example, RF pulse 202 may be a pulse having a constant carrier frequency over its duration. As another example, RF pulse 202 may have a changing carrier frequency over its duration. As yet another example, the RF pulse 202 may be designed to reduce the duration length of the delay interval 206, which as discussed above is significantly due to the coil ringing effect. For example, pulse 202 may be shaped such that it suppresses or attenuates coil ringing. As one non-limiting example, pulse 202 may be pre-emphasized in the frequency domain or in the time domain based on the transfer function of the transmit coil and/or any other suitable model of how the transmit coil attenuates frequency and phase of the input signal. Pre-emphasizing RF pulses is described in more detail below with reference to FIGS. 7-11. It should be appreciated that these examples are illustrative and RF pulse 202 may be any suitable type of RF pulse, as aspects of the technology described herein are not limited in this respect.

Figure 2B:
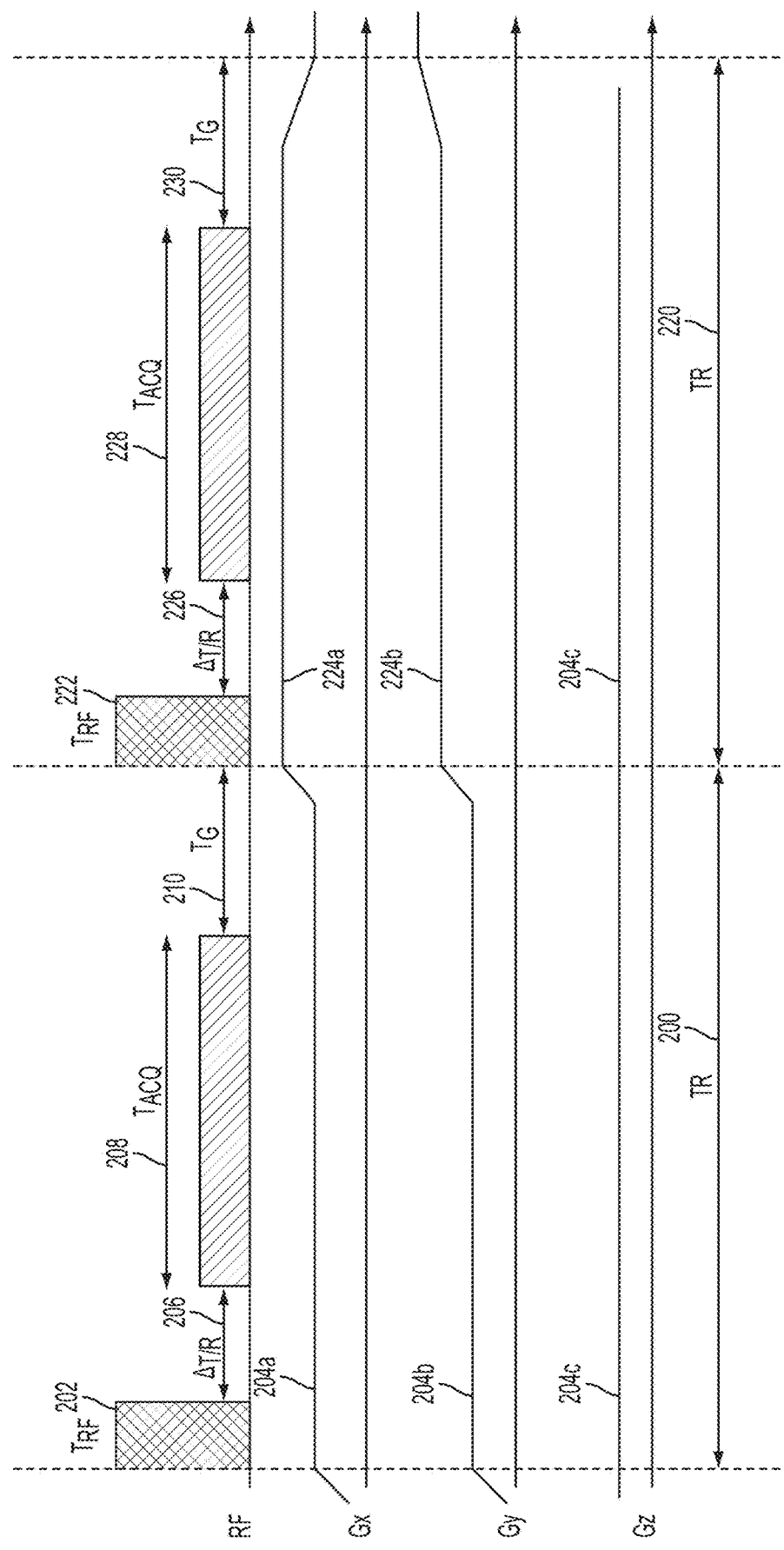
FIG. 2B is a diagram illustrating two consecutive pulse repetition periods of an LF-ZTE pulse sequence, in accordance with some embodiments of the technology described herein.

FIG. 2B illustrates two periods of an illustrative LF-ZTE sequence including pulse repetition period 200 shown in FIG. 2A and a subsequent pulse repetition period 220. As shown in FIG. 2B, gradient switching interval 210 ends and repetition period 220 begins when the gradient fields strengths have changed to their respective next values. In this example, at the end of gradient switching interval 210, the field $G_x$ achieved a strength of 224a (different from its previous strength 204a), the field $G_y$ achieved a strength of 224b (different from its previous strength 204b), and the field $G_z$ stayed at the same strength (204c). While the three gradient fields coils $G_x$, $G_y$, and $G_z$ are being applied at respective fields at 224a, 224b, and 204c, another RF pulse 222 of duration $T_F$ is generated. RF pulse 222 may be any suitable type of pulse, examples of which are provided herein, and may be a same type of pulse as RF pulse 202 or may be a different type of pulse. Next, after a delay 226 of duration $\Delta_{T/R}$ that allows the system to switch from transmit mode to receive mode, the receiving coils are operated to acquire the MR data during acquisition interval 228 of duration $T_{ACQ}$. During, the subsequent interval 230 of duration $T_G$, the strength of one or more gradient fields is changed to one or more other values.

As may be appreciated from FIGS. 2A and 2B, each period of an LF-ZTE pulse sequence comprises transmitting an RF pulse, a delay period until receive coil(s) can acquire data, and acquiring the MR signal while the gradient fields are set to a particular combination of strength values (which values may be time-varying, in some embodiments). An LF-ZTE sequence may comprise multiple such periods, one for each particular combination of gradient field strengths, in order to obtain data from which an image of the subject may be reconstructed. Acquiring data for a particular combination of gradient field strengths corresponds to measuring a trajectory in the 3D Fourier transform of the image of the subject. Thus, the number of repetition periods in an LF-ZTE sequence depends on the number of 3D Fourier "measurements" that are to be obtained in order to generate an image of the subject.

In some embodiments, an LF-ZTE pulse sequence may comprise one or more contrast preparation sequences. For example, as shown in FIG. 2C, an LF-ZTE sequence may comprise contrast preparation pulse sequence 240, followed by one more LF-ZTE pulse repetition periods 242 (e.g., one or more LF-ZTE pulse repetition periods shown in FIG. 2A), followed by another contrast preparation pulse sequence 244, followed by one or more LF-ZTE pulse repetition periods 246 (e.g., one or more of the LF-ZTE pulse repetition periods shown in FIG. 2A), and so on. Each contrast pulse preparation sequence may comprise one or more RF pulses and/or one or more gradient field pulses. Examples of contrast preparation sequences are provided below, though it should be appreciated that contrast preparation pulse sequences (e.g., sequences 240 and 244) may be of any suitable type such that any suitable type of contrast preparation may be used as a part of an LF-ZTE sequence to obtain corresponding contrast weighted images.

For example, T1 contrast preparation may be used with an LF-ZTE sequence by interleaving one or more T1 contrast preparation sequences with one or more pulse repetition periods of an LF-ZTE sequence (e.g., one or more pulse repetition periods 200 described with reference to FIG. 2A). As shown in FIG. 2D, applying a T1 contrast preparation sequence may comprise applying an RF pulse associated with a 180 degree flip angle so that the RF pulse causes the net magnetization of the atoms being imaged to rotate 180 degrees, and waiting for a delay interval 252 of duration $T_{DELAY}$ before applying an LF-ZTE pulse repetition period 254 (e.g., pulse repetition period 200 described with reference to FIG. 2A). As another example, an arterial spin labelling contrast preparation may be used with an LF-ZTE sequence by interleaving one or more arterial spin labelling contrast preparation sequences with the LF-ZTE sequence, whereby each arterial spin labelling preparation sequence comprises an RF pulse associated with a 180 flip angle and the transmit pulse and acquisition periods are timed to detect MR signals as a function of blood flow and/or perfusion.

As another example, an LF-ZTE pulse sequence may be modified to allow for acquisition of data used to generate Overhauser-enhanced MR images. To this end, an LF-ZTE pulse sequence may be interleaved with one or more EPR pulse sequences. As shown in FIG. 2E, applying an EPR pulse sequence may comprise applying an EPR pulse 260 and waiting for a delay interval 262 of duration $T_{DELAY}$ before applying an LF-ZTE pulse repetition period 264 (e.g., pulse repetition period 200 described with reference to FIG. 2A).

As yet another example, an LF-ZTE pulse sequence may be modified to allow for acquisition of data that can be used to compensate for the movement of the subject during imaging. To this end, an LF-ZTE pulse sequence may be interleaved with one or more "navigation" pulse sequences that may be used to collect data that can be compared over time to identify motion in the subject being imaged and correct for that motion during the image generation process. As shown in FIG. 2F, applying a navigation pulse sequence may comprise applying a low flip angle RF pulse 270 and waiting for a delay interval 272 of duration $T_{DELAY}$ before applying an LF-ZTE pulse repetition period with a particular set of gradient field values. The sequence of MR signals obtained after applying the same low flip angle pulse followed by an LF-ZTE pulse repetition period with the same set of gradient field values can be used to detect and/or track motion of the subject and/or may be used to compensate for such motion during image reconstruction.

As yet another example, an LF-ZTE pulse sequence may be interleaved with a pulse sequence for mapping the main magnetic $B_0$ field. For example, an LF-ZTE pulse sequence may be interleaved with a sequence of acquisitions used to map the inhomogeneity in the $B_0$ field. Any of a variety of acquisitions designed to measure the strength of the $B_0$ field off-resonance may be used to map the inhomogeneity in the $B_0$ field such as, for example, multiple echo time gradient echo acquisitions. The sequence of such acquisitions may be termed a $B_0$ off-resonance field mapping sequence. The resulting map of the inhomogeneity in the $B_0$ field may be used, subsequently, during image reconstruction to compensate for any artifacts resulting from $B_0$ inhomogeneity resulting in improved MR images.

As yet another example, a water/fat separation contrast preparation may be used with an LF-ZTE pulse sequence by interleaving one or more water/fat separation contrast pulse sequences with one or more pulse repetition periods of an LF-ZTE sequence (e.g., one or more pulse repetition periods 200 described with reference to FIG. 2A). Applying a water/fat separation contrast preparation sequence may comprise applying a series of RF pulses associated with different flip angles and polarities before applying one or more LF-ZTE pulse repetition periods. For example, as shown in FIG. 2G, applying a water/fat separation contrast preparation sequence comprises applying RF pulse 280 associated with a 90 degree flip angle, sequentially applying four RF pulses 282, 284, 286, and 288 each associated with a 180 degree flip angle, and applying RF pulse 290 associated with a 90 flip angle and having an opposite polarity from RF pulse 280. After these RF pulses are applied one or more pulse repetition periods of an LF-ZTE sequence may be performed—as shown in FIG. 2G, pulse repetition period 292 is applied after RF pulse 290. Different types of water/fat separation contrast preparations may be achieved via different delays between and strengths of RF pulses 280-290.

It should be appreciated that the above LF-ZTE pulse sequences are merely exemplary and that the pulse sequences may be modified in different ways, including the addition of further preparation components to facilitate MR data acquisition according to any number of different protocols and/or contrast types, as LF-ZTE pulses sequences are not limited to the examples described herein. It should be further appreciated that each pulse repetition period of an LF-ZTE sequence may be repeated multiple times (e.g., between 2 and 10 repetitions) with the same or similar parameters (e.g., same or similar RF pulse, same or similar gradient field strengths, etc.) such that the signals acquired across the repeated acquisition periods may be averaged. The number of repetitions over which MR signals are averaged may be selected depending on the resolution and/or image acquisition time desired.

Figure 3:
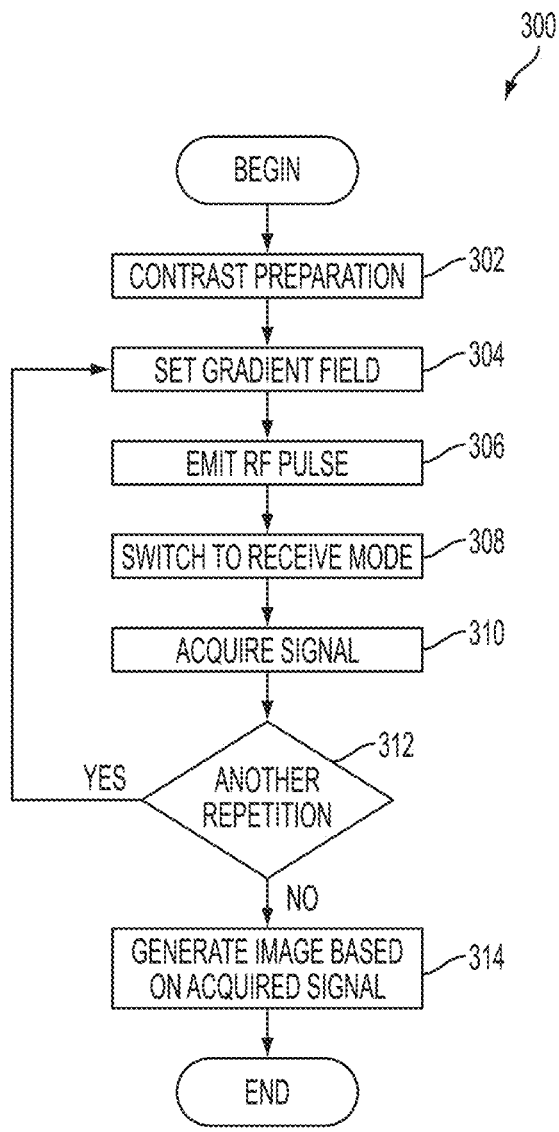
FIG. 3 is a flowchart of an illustrative process for performing MR imaging in a low-field MR system using a low-field zero echo time pulse sequence.

FIG. 3 is a flowchart of an illustrative process 300 for performing low-field MR imaging using a low-field zero echo time pulse sequence with contrast preparation. Process 300 may be performed by any suitable low-field MRI system and, for example, may be performed by using low-field MRI system 100 described with reference to FIG. 1.

Process 300 begins at act 302, where a contrast preparation pulse sequence is applied to the subject being imaged. The contrast preparation pulse sequence may comprise one or multiple RF pulses and/or one or multiple gradient field pulses. When a contrast preparation pulse sequence comprises multiple pulses, the pulses may be applied in accordance with any suitable timing scheme (e.g., simultaneously, at least partially overlapping, sequentially, etc.). Any of numerous types of contrast preparation pulse sequences may be applied including, but not limited to, the examples of contrast preparation pulse sequences described above such as a T1 contrast preparation pulse sequence, an arterial spin labelling contrast preparation pulse sequence, an EPR pulse sequence, a navigation pulse sequence, and a water/fat contrast preparation pulse sequence.

Next, process 300 proceeds to act 304 where the gradient fields $G_x$, $G_y$, and $G_z$ are set to desired strengths (e.g., strengths 204a, 204b, and 204c as shown in FIG. 2A). Once the gradient fields are set to desired strengths, and while the gradient fields are at the desired strengths, an RF pulse is emitted at act 306. Any suitable type of RF pulse may be emitted at act 306, examples of which are provided herein. After the RF pulse is emitted at act 306, the gradient fields remain set to their respective strengths, and the low-field MRI system executing process 300 switches from transmit to receive mode at act 308. The switch may take place over a period of any suitable duration and, for example, over a period long enough for the coil ringing effect to subside sufficiently enough for the receive coils to acquire the MR signal.

After the system has switched to receive mode at act 308, the receive coils are used to acquire the MR signal at act 310. The gradient coils continue to operate, during act 310, so that the acquisition occurs while the gradient fields have strengths to which they were set at act 304. The MR signal obtained at act 310 may be stored for subsequent use in generating an MR image of the subject.

After the MR signal has been acquired, at act 310, process 300 proceeds to decision block 312, where it is determined whether another MR signal should be acquired for another combination of gradient field values. This determination may be made in any suitable way. As described above, acquiring an MR signal for a particular combination of strengths of the gradient fields $G_x$, $G_y$, and $G_z$ corresponds to measuring a trajectory in the 3D Fourier transform of the image of the subject. Thus, in some embodiments, the determination of whether another MR signal should be acquired for another combination of gradient field values may be made based on whether at least one or more points of the 3D Fourier transform should be measured. The number of points (and hence iterations of acts 304-310 of process 300) may therefore depend on the desired MR image resolution, with higher resolution generally requiring more iterations.

When it is determined, at decision block 312, that another MR signal is to be acquired for another combination of gradient field strength values, process 300 returns, via the "YES" branch, to act 304, where the gradient field strength values are set to another set of values. The gradient fields may be set to a combination of strengths in dependence on the trajectory in the 3D Fourier transform of the image for which a measurement is desired, which in turn may depend at least in part on the pattern through which 3D Fourier space (sometimes termed "k-space") is explored. Any suitable pattern of sampling of k-space (i.e., the order of points in k-space for which MR signals are acquired) may be used, as aspects of the technology described herein are not limited in this respect. After the gradient field strength values are set at act 304, acts 306-310 and decision block 312 are repeated.

On the other hand, when it is determined at decision block 312, that another MR signal is not to be acquired, process 300 proceeds, via the "NO" branch to act 314, where an MR image of the subject is generated using the acquired MR signals (e.g., using one or more of the MR signals obtained at act 310 of process 300). This may be done in any suitable way and, for example may be done by (optionally) pre-processing the acquired signals, applying a Fourier transform (e.g., a 3D Fourier transform) to the pre-processed signals to obtain an initial image, and (optionally) processing the initial image to obtain a final image. Pre-processing the acquired signals may comprise demodulating the acquired signals, downsampling the acquired signals (e.g., after demodulating the acquired signals), correcting for motion of the subject, and/or correcting for any other types of artifacts. Processing the initial image may comprise correcting for gridding effects, correcting for RF inhomogeneities, and performing any other suitable image processing.

It should be appreciated that process 300 is illustrative and that there are variations of process 300. For example, although in the embodiment of FIG. 3 a contrast preparation pulse sequence is applied only initially, in other embodiments a contrast preparation pulse sequence may be applied multiple times. For example, in some embodiments, when it is determined, at decision block 312, that another MR signal is to be acquired for another combination of gradient field strength values, process 300 returns, via the "YES" branch, to act 302 (rather than act 304 as shown in FIG. 3), where a contrast preparation pulse sequence may be applied.

As described above, the inventors have appreciated that low-field refocusing (LFR) pulse sequences are another class of pulse sequences particularly suitable to the low-field MRI setting due, at least in part, to the speed with which they can be performed. One non-limiting example of LFR pulse sequences designed by the inventors includes low-field balanced steady state free precession (LF-bSSFP) pulse sequences. The inventors have also recognized that, while balanced steady state free precession pulse sequences may be unsuitable for high-field MRI due to strict constraints on $B_0$ field homogeneity and/or specific absorption rate, the LF-bSSFP pulse sequences described in further detail below provide an attractive solution due in part to the generally superior homogeneity that can be achieved at low-field strengths.

As described above, LF-bSSFP pulse sequences are only one example of the more general class of LFR pulse sequences, which contains other low-field refocusing pulse sequences. For example, the general class of LFR pulse sequences includes pulse sequences obtained by modifying a low field pulse sequence (e.g., a low-field gradient echo pulse sequence, a low-field spin echo pulse sequence, etc.) through the introduction of a refocusing stage toward the end (e.g., at the end) of one or more (e.g., all) repetition periods of the low-field pulse sequence. The introduction of a refocusing stage into a repetition period serves to reverse or undo the magnetic dephasing resulting from the application of the gradient fields prior to application of the refocusing stage. For example, a refocusing stage may be introduced into a pulse repetition period such that the sum of the field strengths of each gradient field across the duration of the pulse repetition period is zero. This is explained in more detail below with respect to LF-bSSFP pulse sequences. As a result, LFR pulse sequences may be used as a framework to support other pulse sequences (e.g., spin echo, gradient echo, echo-planar, etc.) to facilitate implementing such sequences in the low field context.

Figure 4:
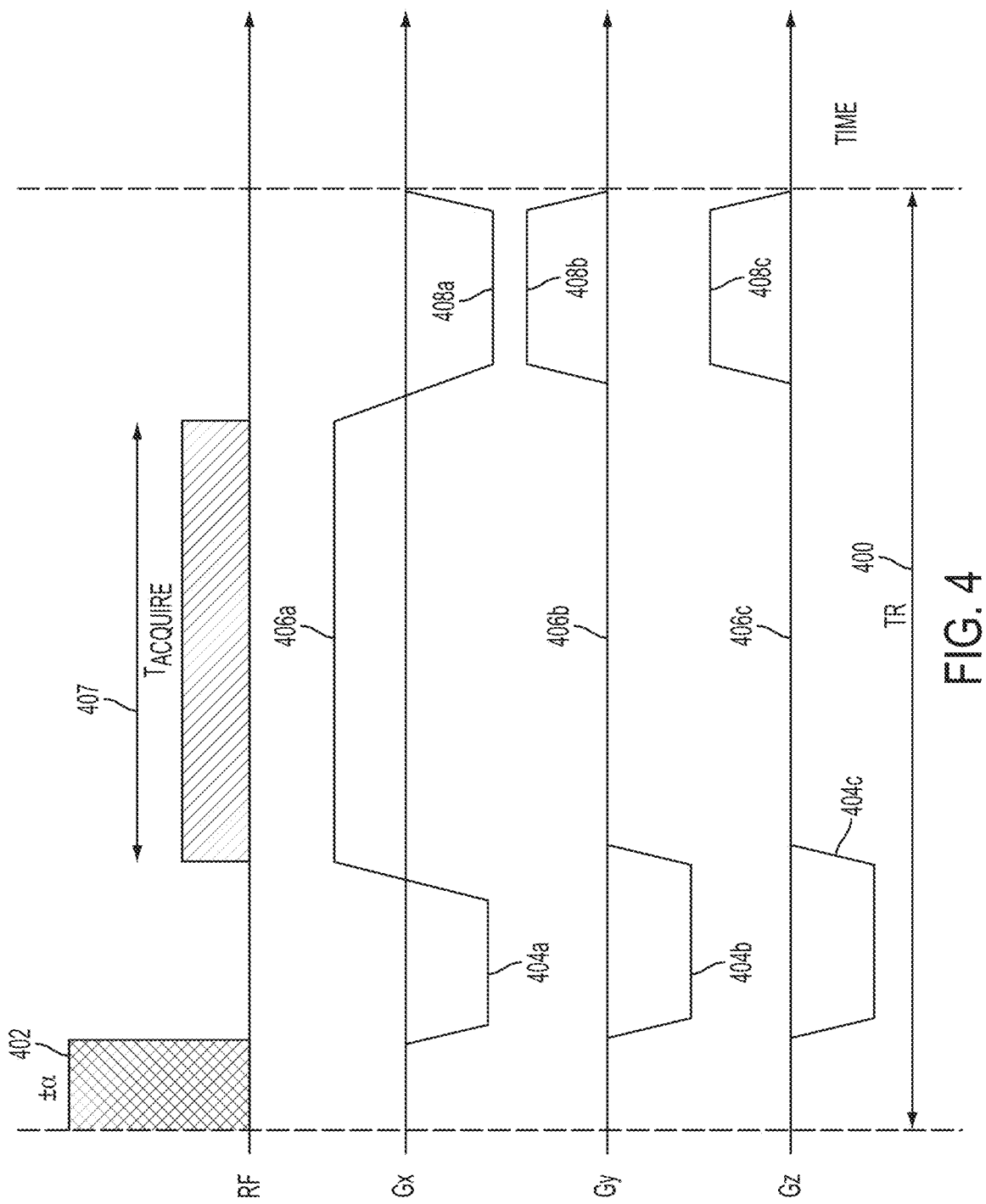
FIG. 4 is a diagram illustrating one pulse repetition period of a low-field balanced steady-state free precession (LFbSSFP) sequence, in accordance with some embodiments of the technology described herein.

FIG. 4 is a diagram illustrating one pulse repetition period 400 having duration $T_R$ of an exemplary LF-bSSFP sequence, in accordance with some embodiments of the technology described herein. Initially, an RF pulse 402 associated with flip angle α is applied. In some embodiments, a large flip angle (e.g., flip angles between 50-90 degrees) may be used. Though, in other embodiments, any suitable flip angle (e.g., a flip angle in the range of 30-150 degrees) may be used, as aspects of the technology described herein are not limited in this respect. Flip angle ±α shown above pulse 402 indicates that, in some embodiments, the polarity of the RF pulse may be flipped for each pulse repetition period (i.e., in one pulse repetition period an RF pulse associated with flip angle α is applied, an RF pulse associated with flip angle −α is applied during the subsequent pulse repetition period, an RF pulse associated with flip angle α is applied during the subsequent pulse repetition period, and so on). Any suitable type of RF pulse may be applied including, but not limited to, frequency-modulated pulses, constant-frequency pulses, pulses designed to reduce the coil ring down period, and phase-modulated pulses.

As shown in FIG. 4, no gradient fields are applied during application of the RF pulse 402. In other embodiments, however, a gradient field may be applied during application of the RF pulse 402 so that the RF pulse 402 may be designed to include a range of one or more frequencies to excite a desired portion (e.g., a desired slice or slab) of the subject being imaged).

After RF pulse 402 is applied, gradient fields $G_x$, $G_y$, and $G_z$ are applied at respective operating strengths of 404a, 404b, and 404c during the so-called "pre-phase" stage of the LF-bSSFP sequence. Next, during acquisition stage 407 having duration $T_{ACQUIRE}$, the receiving coils acquire the MR signal while two of the gradient fields are turned off and the polarity of one of the gradient fields is reversed. For example, as illustrated in FIG. 4, the gradient fields $G_y$ and $G_z$ are turned off (their strengths are set to 0) and the polarity of the gradient field $G_x$ is reversed, with the strength of the gradient field $G_x$ set to 406c. After the acquisition stage 407, gradient fields $G_x$, $G_y$, and $G_z$ are applied at respective operating strengths of 408a, 408b, and 408c during the so-called "refocusing" stage of the LF-bSSFP sequence such that the dephasing resulting from the application of the gradient fields during the pre-phase and acquisition stages is reversed or undone. The strengths and polarities of the gradient fields are chosen such that the sum of the field strengths of each field across the duration $T_R$ of pulse repetition period 400 is zero (which is why this sequence is termed "balanced"). Thus, in some embodiments, the strengths and polarities of the gradient fields are chosen such that the following conditions are satisfied:

$$\int_0^{T_R} G_x dt = 0,$$

$$\int_0^{T_R} G_y dt = 0, \text{ and}$$

$$\int_0^{T_R} G_z dt = 0.$$

Conventionally, when a b-SFFP sequence is applied, the flip angle α associated with the RF pulses is chosen to maximize the net transverse magnetization. In particular, the flip angle α may be set as a function of $T_1$ and $T_2$ relaxation times according to:

$$\cos(\alpha) = \frac{T_1/T_2 - 1}{T_1/T_2 + 1}.$$

Figure 5:
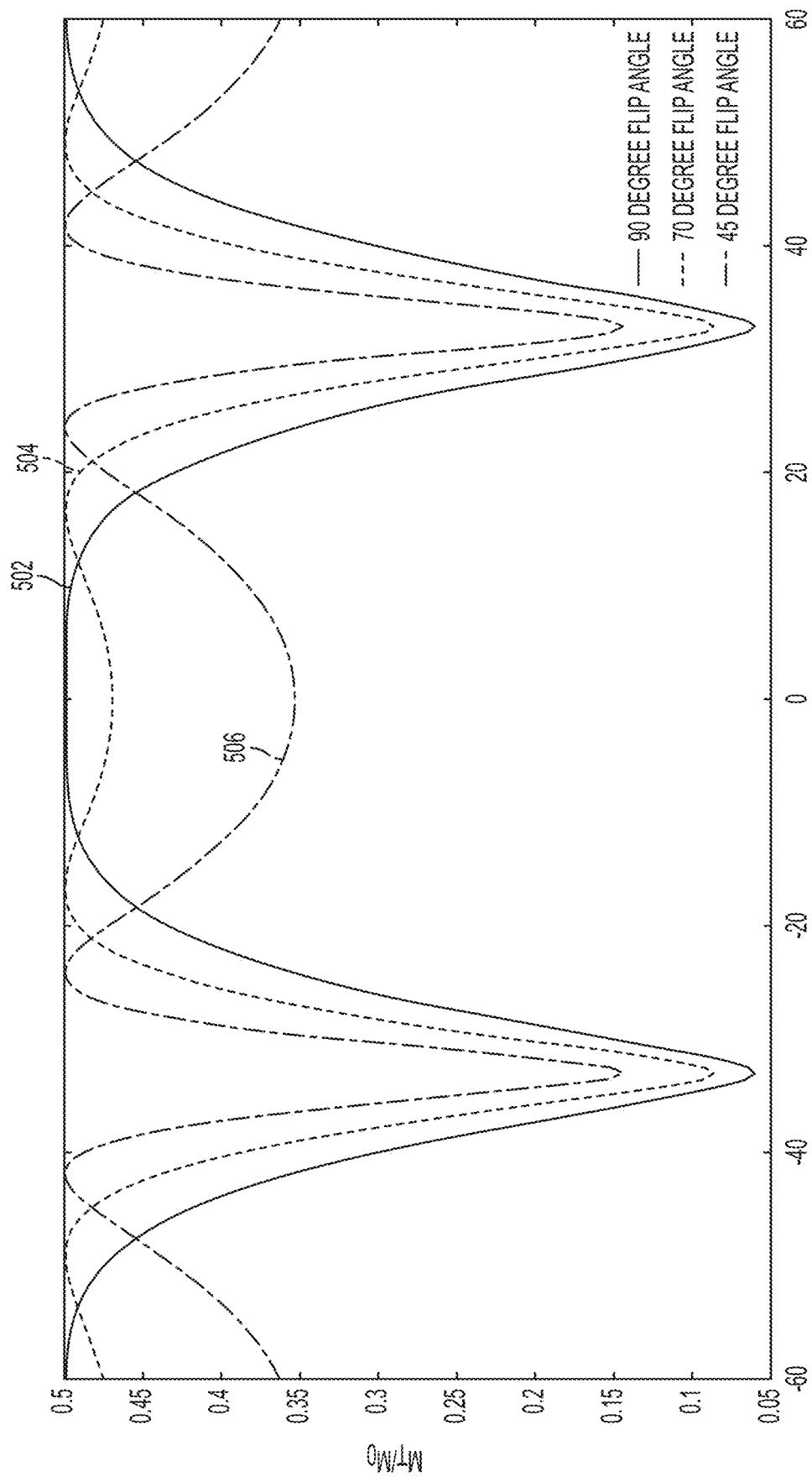
FIG. 5 is a diagram illustrating the effect of magnetic field inhomogeneity on the strength of transverse magnetization for different flip angles, in accordance with some embodiments of the technology described herein.

At low-field, the $T_1$ and $T_2$ relaxation times are approximately equal so that using the above formula results in RF pulses associated with a flip angle of 90 degrees. However, the inventors have appreciated in the low-field context, RF pulses associated with a flip angle of 90 degrees may not be the optimal choice. Based on this insight, the inventors have recognized that rather than selecting a flip angle to maximizing the net transverse magnetization assuming homogeneity of $B_0$, a flip angle may be chosen to instead reduce the effect of $B_0$ inhomogeneities on the net transverse magnetization. FIG. 5 shows, for each of multiple flip angles, the relationship between the ratio of net transverse magnetization ($M_T$) to longitudinal magnetization ($M_O$) and deviation (in degrees) from homogeneity of the main magnetic field $B_0$. This relationship is shown for flip angles of 90 degrees, 70 degrees, and 45 degrees by curves 502, 504, and 506, respectively. As may be appreciated from FIG. 5, flip angles of less than 90 degrees (e.g., 70 degrees) provide a higher net magnetization (on average) across a wider range of $B_0$ inhomogeneity.

Accordingly, in some embodiments, a low-field MRI system may be configured to use an LF-bSSFP sequence whereby the RF excitation pulses in the LF-bSSFP sequence are associated with a flip angle that reduces the effect of $B_0$ inhomogeneities on the net transverse magnetization. For example, a flip angle less than 90 degrees may be used in some embodiments. As another example, a flip angle in the 60-80 degree range may be used. As yet another example, a flip angle in the 65-75 degree range may be used, and as yet another example a flip angle of approximately 70 degrees is used. It should be appreciated that the above described LF-bSSFP pulse sequences are merely exemplary and may be modified in a number of ways, for example, to include various preparation components (e.g., preparation pulses or pulse sequence) for various contrast types including, but not limited to OMRI-enhanced imaging, T1 and T2-weighted imaging, DW imaging, arterial spin labeling, etc., as the aspects are not limited in this respect.

As may be appreciated from the embodiment illustrated in FIG. 4, the flip angle induced by the RF pulse may be varied across pulse repetition periods of a pulse sequence. Varying the flip angles across pulse repetition periods and averaging the MR signal so obtained may eliminate or reduce the effect that inhomogeneity in the $B_1$ field has on images generated from the MR signal. Additionally or alternatively, varying the flip angles across pulse repetition periods allows for the acquisition of a single image, formed from MR signals obtained in response to excitation by RF pulses associated with different flip angles, having different contrasts at different flip angles. The sequence of flip angles may be a sequence of alternating flip angles (e.g., $\pm\alpha$ as shown in FIG. 4) or any other suitable sequence of flip angles (e.g., any suitable sequence of flip angles in the range of 30-150 degrees). For example, in some embodiments, the sequence of flip angles used may be generated according to a signal model (e.g., a parametric signal model), and the signal model may be subsequently employed in performing image reconstruction from the obtained MR signal. The sequence of flip angles is not limited to having only two different flip angle values (e.g., $\pm\alpha$) and, for example, may include 2-20 different flip angle values, as a pulse sequence is not limited by the number of flip angles that RF pulses in the sequence are designed to produce.

The inventors have also recognized that pulse sequences can be designed to identify and/or compensate for inhomogeneity in the main magnetic $B_0$ field to reduce or eliminate the effect of the inhomogeneity on resulting images. The inventors have developed pulse sequences that may be used to identify and/or compensate for $B_0$ inhomogeneity in the low-field as well as the high-field settings. Such pulse sequences may be used to generate higher-quality images in the presence of main magnetic field inhomogeneity than would be possible when using conventional pulse sequences. Conventional approaches to generating a more homogeneous $B_0$ field rely on additional and expensive hardware components (e.g., additional magnetics components). On the other hand, using pulse sequences to compensate for main magnetic field inhomogeneity, as described herein, provides for a lower cost solution because such pulse sequences can be used to generate medically-relevant MR imagery despite relatively high levels of main magnetic field inhomogeneity.

Accordingly, in some embodiments, one or more parameters of RF pulses across pulse repetition periods of a pulse sequence may be varied in order to identify and/or compensate for inhomogeneity in the $B_0$ field so as to reduce or eliminate the effect of the inhomogeneity on generated images. For example, the frequencies and/or phases of the RF pulses across pulse repetition periods may be varied to compensate for $B_0$ inhomogeneity. The parameter(s) of RF pulses may be varied in any type of MR pulse sequence including high-field and low-field MR pulse sequences (e.g., low-field zero echo time (LF-ZTE) pulse sequences and low-field refocusing (LFR) pulse sequences, such as low-field balanced steady state free precession (LF-bSSFP) pulse sequences).

In some embodiments, the frequency of the RF pulses used in a pulse sequence may be varied across a small range of frequencies. For example, the center frequency of RF pulses in a series of RF pulses corresponding to a respective series of pulse repetition periods of the pulse sequence may be varied over a range of 10-25 Hz, 10-100 Hz, 100-200 Hz, or 10-200 Hz, such that the maximum difference between center frequencies of any two RF pulses in the series falls in the range. The center frequency of RF pulses in the series of RF pulses may vary linearly during the respective series of pulse repetition periods. For example, in some embodiments, the center frequencies of RF pulses in a series of RF pulses may change in accordance with a step-wise sweep across a range of frequencies (e.g., from the lowest to the highest frequency in the range or vice-versa) using a fixed step size such that the center frequency of the RF pulses may change by a fixed amount corresponding to the step size between each pair of successive pulses in the series of RF pulses.

As another example, in a LF-bSSFP sequence, the center frequencies of RF pulses in a pulse sequence may be varied over a range of frequencies, which is determined based on the duration of a single pulse repetition period of the pulse sequence. For example, the center frequencies of RF pulses in a pulse sequence may be varied within $\pm 1/T_R$ of a center frequency selected for a particular flip angle, where $T_R$ is the duration of a pulse repetition period of the pulse sequence. As a specific non-limiting example, in pulse sequences in which the duration of a pulse repetition period is in the range of 3 to 50 milliseconds, the frequency of the RF pulses may be varied by tens of Hertz (e.g., the frequency may vary by $\pm 10$ Hz from a center frequency, which may be selected for a particular flip angle) or low hundreds of Hertz (e.g., the frequency may vary by $\pm 100$ Hz from a center frequency, which may be selected for a particular flip angle). Varying the frequency in this way allows for compensating the obtained MR signal for variations that result from $B_0$ inhomogeneities. In addition, varying the RF pulse frequency in this way allows for the generation of a map of $B_0$ inhomogeneities, which may be subsequently used to unwarp images in which the inhomogeneity caused distortion of the encoding gradient fields. The unwarping of an image may be performed in any suitable way and, for example, may be performed by applying a distortion correction to the image on a pixel-by-pixel basis with the values of the distortion correction calculated based on the map of $B_0$ inhomogeneity and the gradient field values.

In some embodiments, the frequency of the RF pulses used in a pulse sequence may be varied across a wider range of frequencies. For example, the center frequency of RF pulses in a series of RF pulses corresponding to a respective series of pulse repetition periods of the pulse sequence may be varied over a range of 200 Hz-1 kHz, 500 Hz-10 kHz, or 10 kHz-100 kHz, such that the maximum difference between center frequencies of any two RF pulses in the series falls in the range. As described above, the center frequencies may be varied linearly and, in some embodiments, by sweeping out the range in fixed step sizes. Varying the RF pulse frequency in this way may be used to cover the whole $B_0$ range (when there are inhomogeneities in the $B_0$ field) over multiple acquisitions in a situation where the bandwidth of an RF pulse at a single frequency is too low to cover the entire $B_0$ range. As in the case of varying the RF pulse frequency across a small range, varying the RF pulse frequency over a wider range also allows for compensation for (even greater) inhomogeneity in the received MR signal and for generation of a $B_0$ inhomogeneity map, which among other things may be used to unwarp images.

In some embodiments, a $B_0$ inhomogeneity map may be generated from a set of images obtained using a pulse sequence (or multiple pulse sequences) in which the frequency of the RF pulses varies across pulse repetition periods of the sequence. The set of images may be used to estimate the $B_0$ inhomogeneity map on a voxel-by-voxel basis. For example, in some embodiments, the magnitudes and phases of a particular voxel across the set of images may be used estimate the strength of the $B_0$ field at the particular voxel. However, the $B_0$ inhomogeneity map may be estimated from data obtained using a pulse sequence having a varying RF pulse frequency in any other suitable way, as aspects of the technology described herein are not limited in this respect.

In some embodiments, the phases of the RF transmit pulses may be varied across pulse repetition periods of a pulse sequence. Varying the phases of RF pulses increases the signal/noise ratio (SNR) of the received MR signal because, when the MR signals obtained through the use of pulses with varying phases are averaged, sensed signals that are not coherent with the varied transmit RF phase are canceled. In addition, varying the phases of RF pulses to simulate a change in frequency may be used to implement frequency shifts, in some embodiments.

As may be appreciated from the foregoing, various characteristics of the RF pulses may be varied over the duration of a pulse repetition sequence. These characteristics include, but are not limited to, the flip angles induced by the RF pulses, the frequencies of the pulses, and the phases of the RF pulses. One or more of these characteristics may be varied at the same time. Such variation provides numerous benefits including: compensating for inhomogeneities in the $B_0$ and $B_1$ fields, mapping the inhomogeneity in the B0 field and using the generated map to remove artifacts (e.g., unwarp) in generated images, and to increase the signal to noise ratio of the obtained MR signal.

The inventors have also recognized that varying characteristics of RF pulses over the duration of a pulse repetition sequence may help to correct the obtained MR signal for frequency drift of the main magnetic field, which may occur during operation of the MR system (e.g., due to the heating of the MR system during operation). Accordingly, in some embodiments, the frequency drift of the main magnetic field may be measured during a pulse sequence and the center frequency of the RF pulses in the pulse sequence may be adjusted based on the measured frequency drift. In this way, the pulse sequence may adapt to the frequency drift of the main magnetic field. The frequency drift of the main magnetic field may be measured by using a temperature probe, a voltage sensor, and/or in any other suitable way.

Figure 6:
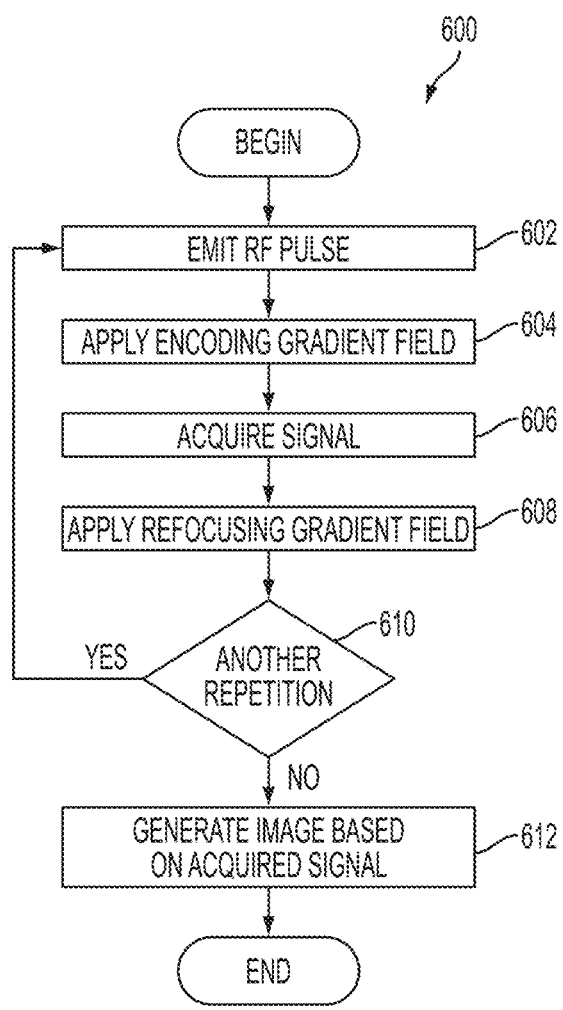
FIG. 6 is a flowchart of an illustrative process for performing MR imaging in a low-field MR system using an LF-bSSFP sequence, in accordance with some embodiments of the technology described herein.

FIG. 6 is a flowchart of an illustrative process 600 for performing MR imaging in a low-field MR system using an LF-bSSFP sequence, in accordance with some embodiments of the technology described herein. Process 600 may be performed by any suitable low-field MRI system and, for example, may be performed by using low-field MRI system 100 described with reference to FIG. 1.

Process 600 begins at act 602, where an RF pulse is emitted. Examples of RF pulses that may be used are provided herein. In some embodiments, the RF pulse may be associated with a flip angle $\alpha$ selected to reduce the effect of $B_0$ inhomogeneities on the net transverse magnetization. In other embodiments, the RF pulse may be associated with a flip angle selected to maximize net transverse magnetization assuming a homogenous $B_0$ field.

Next, process 600 proceeds to act 604 (the "pre-phasing" stage), where gradient fields having a first combination of respective strengths (e.g., strengths 404a, 404b, and 404c) are applied to encode the MR signal. Next, process 600 proceeds to act 606 (the "acquisition" stage), where the receiving coils acquire the MR signal while two of the three gradient fields (e.g., the phase and frequency encoding fields) are turned off and the polarity of one of the magnetic fields (e.g., the slice selection field) is reversed. It should be noted that one of the gradient fields remains turned on during the acquisition stage. Next, process 600 proceeds to act 608 (the "refocusing" stage), where gradient fields are applied with strengths and polarities selected such that the average strength of each of the magnetic fields is 0 across the duration $T_R$ of a pulse repetition period of the pulse sequence.

Next, process 600 proceeds to decision block 610, where it is determined whether another MR signal should be acquired for another combination of gradient field values. This determination may be made in any suitable way. As described above, acquiring an MR signal for a particular combination of strengths of the gradient fields $G_x$, $G_y$, and $G_z$ corresponds to measuring a point in the 3D Fourier transform of the image of the subject. Thus, in some embodiments, the determination of whether another MR signal should be acquired for another combination of gradient field values may be made based on whether at least one more point of the 3D Fourier transform should be measured. The number of points (and hence iterations of acts 602-608 of process 600) may therefore depend on the desired MR image resolution, with higher resolution generally requiring more iterations.

When it is determined, at decision block 610, that another MR signal is to be acquired for another combination of gradient field strength values, process 600 returns, via the "YES" branch, to act 602, where another RF pulse is emitted. As discussed above, in some embodiments, the RF pulse emitted may be associated with a flip angle $(-\alpha)$ having an opposite sign of the flip angle $(\alpha)$ associated with the RF pulse emitted during the immediately preceding pulse period. Acts 604-608 are then repeated, during which repetition another acquisition of the MR signal is performed and one or more of the gradient field strength values are set to different value(s).

On the other hand, when it is determined at decision block 610, that another MR signal is not to be acquired, process 600 proceeds, via the "NO" branch, to act 612 where an MR image of the subject is generated using the acquired MR signals (e.g., using one or more of the MR signals obtained at act 606 of process 600). This may be done in any suitable way and, for example may be done in any of the ways described with reference to act 314 of process 300.

It should be appreciated that process 600 is illustrative and that there are variations of process 600. For example, although the LF-bSSFP sequence illustrated in FIG. 6 does not include a contrast preparation pulse sequence, in some embodiments an LF-bSSFP sequence may be interleaved with one or more contrast preparation pulse sequences, for example, to provide a support framework for implementing such pulse sequences in the low field context.

As described above, conventional pulse sequences developed for high-field MRI are generally unsuitable for application in a low field environment at least in part due to the significant differences in the operating parameters of high- and low-field MRI. Some of these differences are illustrated in Tables 1 and 2 below. Table 1 shows a side-by-side comparison of operating parameters for a conventional high-field ZTE pulse sequence and a low-field ZTE (LF-ZTE) pulse sequence developed by the inventors. Table 2 shows a side-by-side comparison of operating parameters for a conventional high-field bSSFP pulse sequence and a low-field bSSFP (LF-bSSFP) pulse sequence developed by the inventors.

TABLE 1

| ZTE Pulse Sequence | Low-Field MRI (LF-ZTE) | High-Field MRI (ZTE) |
|---|---|---|
| B0 Strength | 25 microT-0.2 T, 0.1 T | .2 T-10 T |
| B0 Homogeneity | .001 ppm-10 Kppm, 10-50 ppm | .1-15 ppm |
| Gx - range of strengths | 1-40 milliT/meter | 40-80 milliT/meter |
| Gy - range of strengths | 1-40 milliT/meter | 40-80 milliT/meter |
| Gz - range of strengths | 1-40 milliT/meter | 40-80 milliT/meter |
| RF Pulse Amplitude | 10-1000 microT | 5-15 microT |
| RF Pulse Center Frequency | 2 KHz-10 MHz, 4 MHz (for 0.1 T B0) | 60-300 MHZ, 64 MHz (for 1.5T B0), 127 MHz (for 3.0 T B0) |
| RF Pulse Shape (envelope) | Hard pulse, pre-emphasized pulse, frequency-modulated pulse, amplitude-modulated pulse | Hard pulse |
| Induced Flip Angle | 15-50 degrees | 0-6 degrees, 2-4 degrees |
| Maximum Transverse Magnetization (e.g., $M_T/M_0$) | 15-100% | 0-15% |
| Duration RF pulse | 1 microsecond-1 millisecond | 4-40 microseconds |
| Duration T/R switch period | 4-100 microseconds | 4-100 microseconds |
| Duration Acquisition period | 0.5 millisecond-20 milliseconds | 0.5-20 milliseconds |
| Duration gradient ramp up period | 10 microseconds-1 millisecond | 1-10 milliseconds |
| Duration of Repetition Period (TR) | 1-50 milliseconds | 1-25 milliseconds |
| Number of TRs to average for single measurement to boost SNR | 2-8 | 0.5 to 3 |

TABLE 2

| b-SSFP Pulse Sequence | Low-Field MRI (LF-bSSFP) | High-Field MRI (bSSFP) |
|---|---|---|
| B0 Strength | 25 microT-0.2 T, 0.1 T | 0.2 T-10 T |
| B0 Homogeneity | .001 ppm-10 Kppm, 10-50 ppm | 0.01-15 ppm |
| Gx - range of strengths | 1-20 milliT/meter | 40-80 milliT/meter |
| Gy - range of strengths | 1-20 milliT/meter | 40-80 milliT/meter |
| Gz - range of strengths | 1-20 milliT/meter | 40-80 milliT/meter |
| RF Pulse Amplitude | 10-50 microT | 5-15 microT |
| RF Pulse Center Frequency | 2 KHz-10 MHz, 4 MHz (for 0.1 T B0) | 60-300 MHZ, 64 MHz (for 1.5 T B0), 127 MHz (for 3.0 T B0) |
| RF Pulse Shape | Hard pulse, frequency selective pulse | Hard pulse, frequency selective pulse |
| Induced Flip Angle | 30-120 degrees | 30-90 degrees |
| Maximum Transverse Magnetization (e.g., $M_T/M_0$) | 50% | 50% |
| Duration RF pulse | 10 microseconds-3 milliseconds | 0.5-3 milliseconds |
| Duration Encoding Period | 0.5-10 milliseconds | 0.5-3 milliseconds |
| Duration Acquisition period | 1-20 milliseconds | 1-10 milliseconds |
| Duration Refocusing Period | 0.5-10 milliseconds | 0.5-3 milliseconds |
| Duration of Repetition Period (TR) | 3-50 milliseconds | 3-20 milliseconds |
| Number of TRs to average for single measurement to boost SNR | 2-8 | 0.5 to 2 |

As described above, in some embodiments, an RF pulse may be pre-emphasized to counteract the attenuation induced to the RF pulse by an RF transmit coil (which may also be the receive coil), which in turn serves to reduce the above-described coil ringing effect. As described in more detail below, an RF pulse may be pre-emphasized based on the transfer function of the RF transmit coil (e.g., by modulating the RF pulse with the inverse of the coil transfer function). This is explained with reference to FIGS. 7-11 below. Pre-emphasis may be applied to any input RF signal for the purpose of synthesizing an ideal or wider-bandwidth output from the transmit RF coil.

Figure 7:
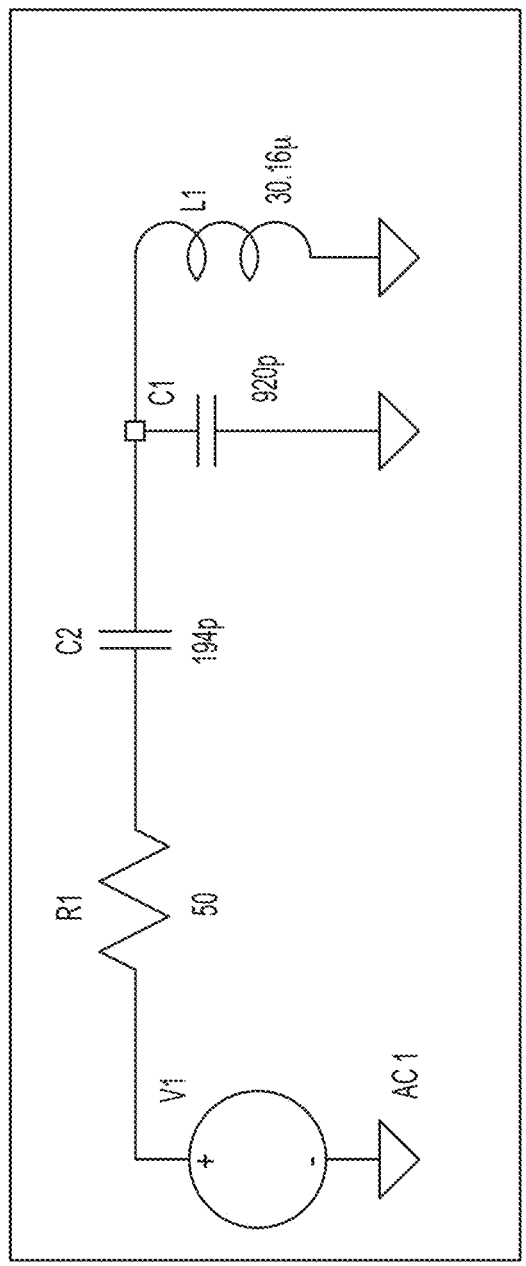
FIG. 7 is a schematic of a low-field radio frequency (RF) coil, in accordance with some embodiments of the technology described herein.
Figure 8:
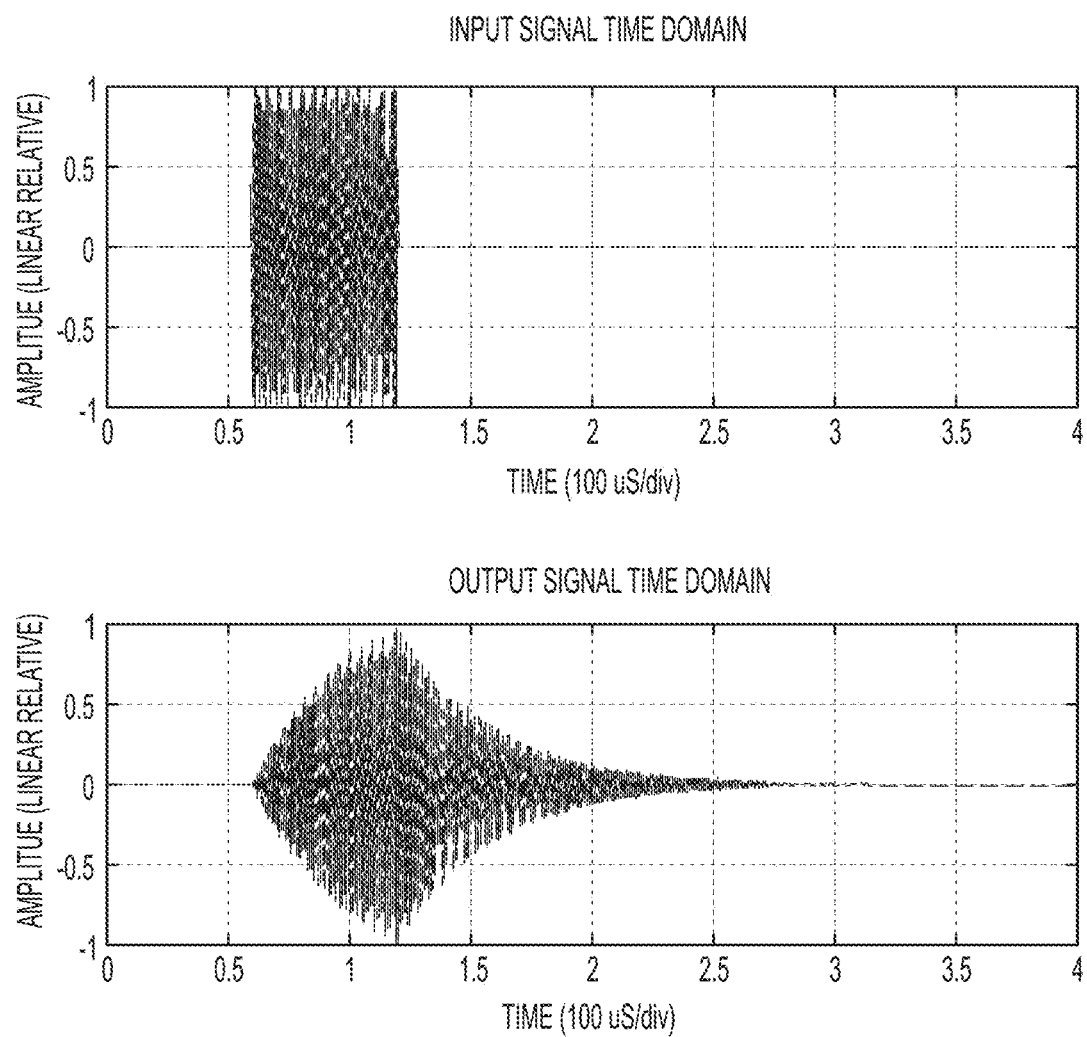
FIG. 8 illustrates, in the time domain, input current to the low-field RF coil and corresponding output from the low-field RF coil without pre-emphasis applied, in accordance with some embodiments of the technology described herein.
Figure 9:
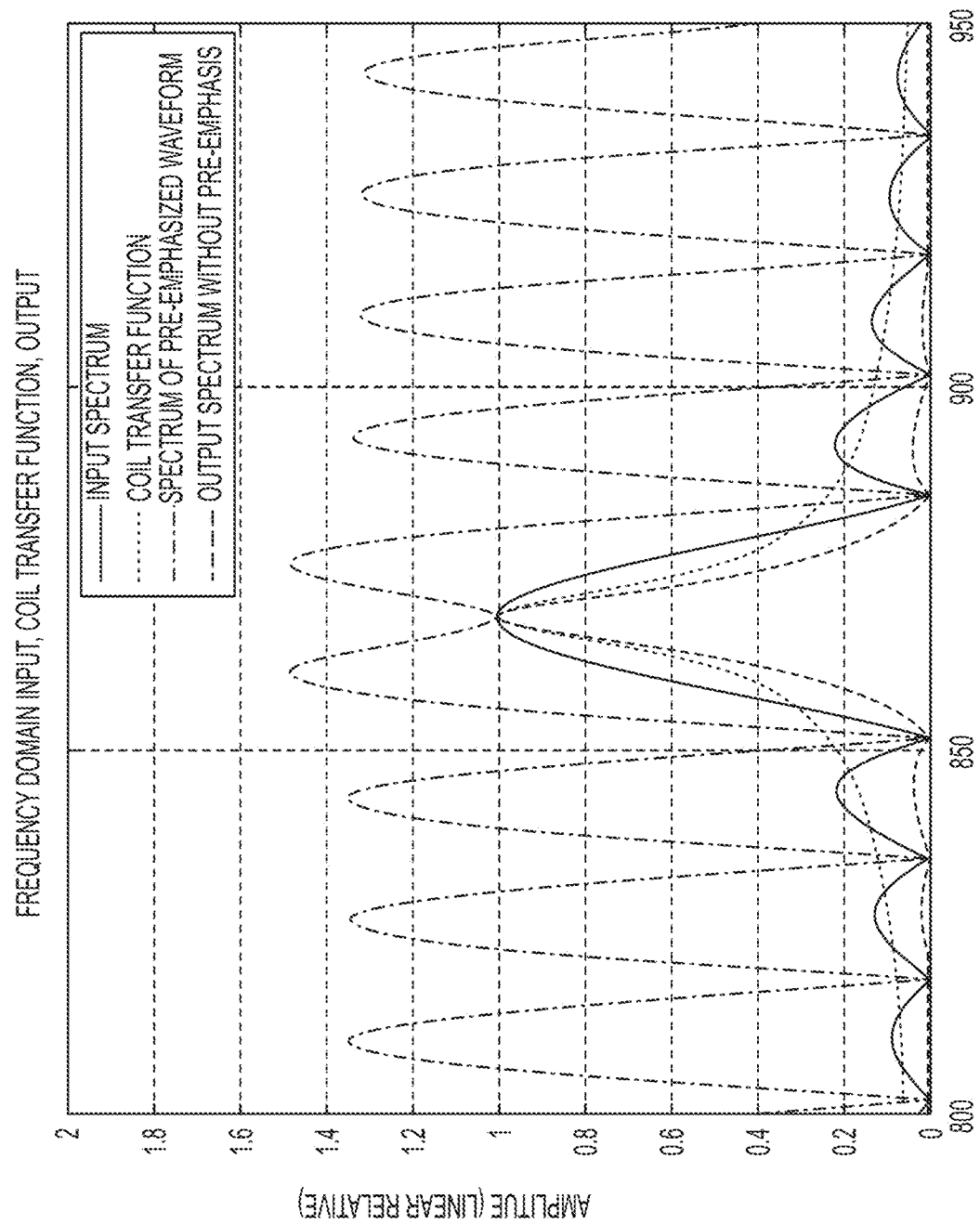
FIG. 9 illustrates, in the frequency domain, how input current to the low-field LF coil is attenuated by the low-field RF coil and how pre-emphasis may be used to counteract such attenuation, in accordance with some embodiments of the technology described herein.

FIGS. 7, 8, and 9 illustrate how a RF transmit coil (e.g., an RF coil in a low-field MRI system) modifies input current based on the coil's transfer function. FIG. 7 is a schematic diagram of an illustrative low-field RF transmit coil. FIG. 8 illustrates input current (top view) for a 60 microsecond pulse having a center frequency of 868 KHz and corresponding output current measured in the coil circuit shown in FIG. 7 across L1 (bottom view). As shown in FIG. 8, the output current measured across L1 is significantly different from the input current to the RF coil. In particular, the output current measured across L1 is a delayed and band-limited version of the input current. FIG. 9 further illustrates, in the frequency domain, the attenuation induced to the input RF pulse by the RF coil of FIG. 7. In particular, FIG. 9 shows the spectrum of the input current (solid line), the transfer function of the RF coil (dotted line), and the spectrum of the output current (dash dot line). It can be seen that the RF coil passes the center frequency of the input current, but attenuates its higher and lower frequency sidebands. These sidebands provide the quick rising and falling edge of the pulse modulation of the input waveform. Attenuating these sidebands will introduce delays or lags in the time domain. As a result, the duration of output signal is longer than that of the input signal and the resulting RF pulse takes longer to transmit than it would have if the input current were not attenuated by the transmit coil.

In some embodiments, attenuation (e.g., of the sidebands or other frequency components of the waveform before or after its center frequency) induced to the input current by the RF coil may be counteracted by pre-emphasizing the input current by an appropriate pre-emphasis function. For example, input current may be pre-emphasized using the inverse of the RF coil transfer function as the pre-emphasis function. The pre-emphasis may be performed in time domain (e.g., using convolution), in the frequency domain (e.g., using discrete Fourier transforms), or in any other suitable way.

Figure 10:
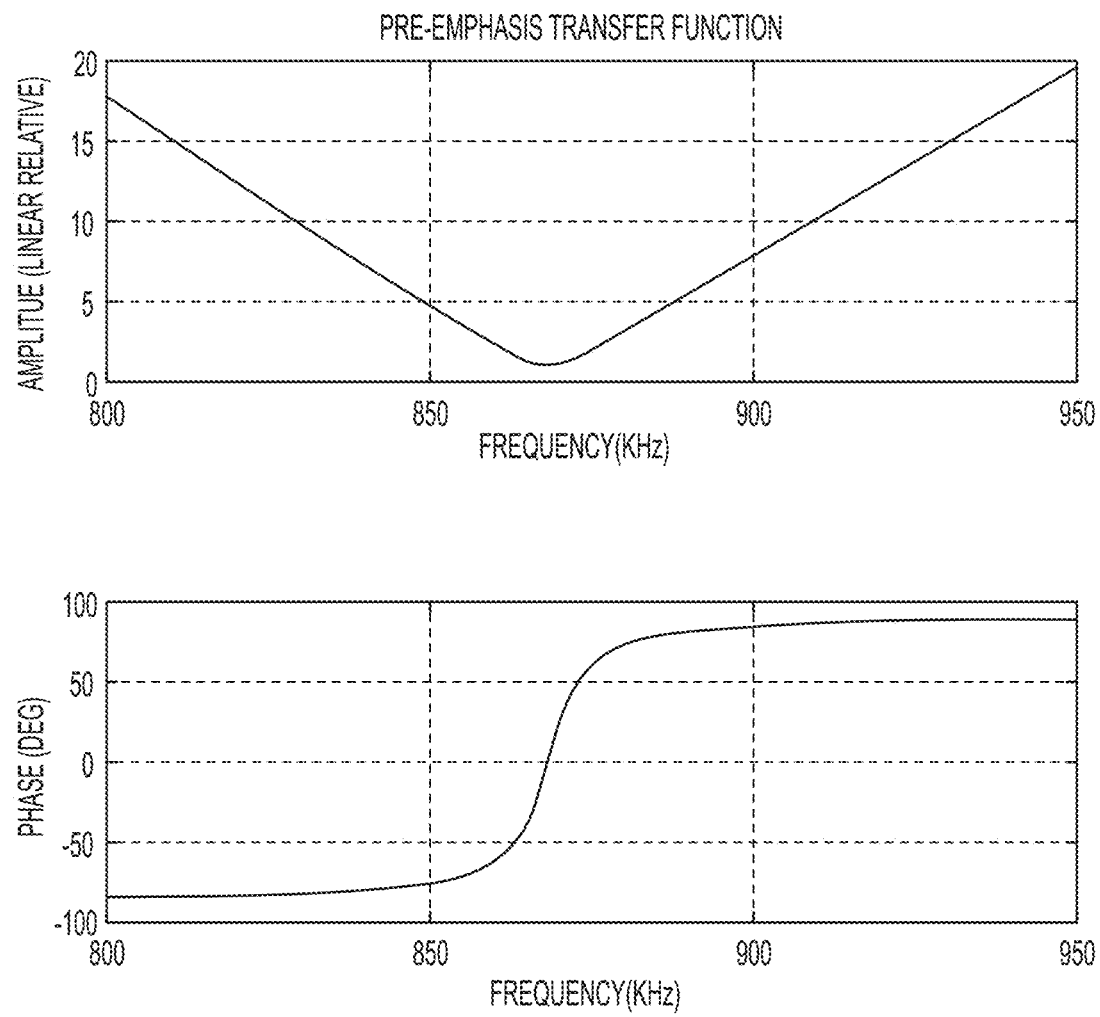
FIG. 10 illustrates, in the frequency domain, a pre-emphasis waveform, in accordance with some embodiments of the technology of the technology described herein.
Figure 11:
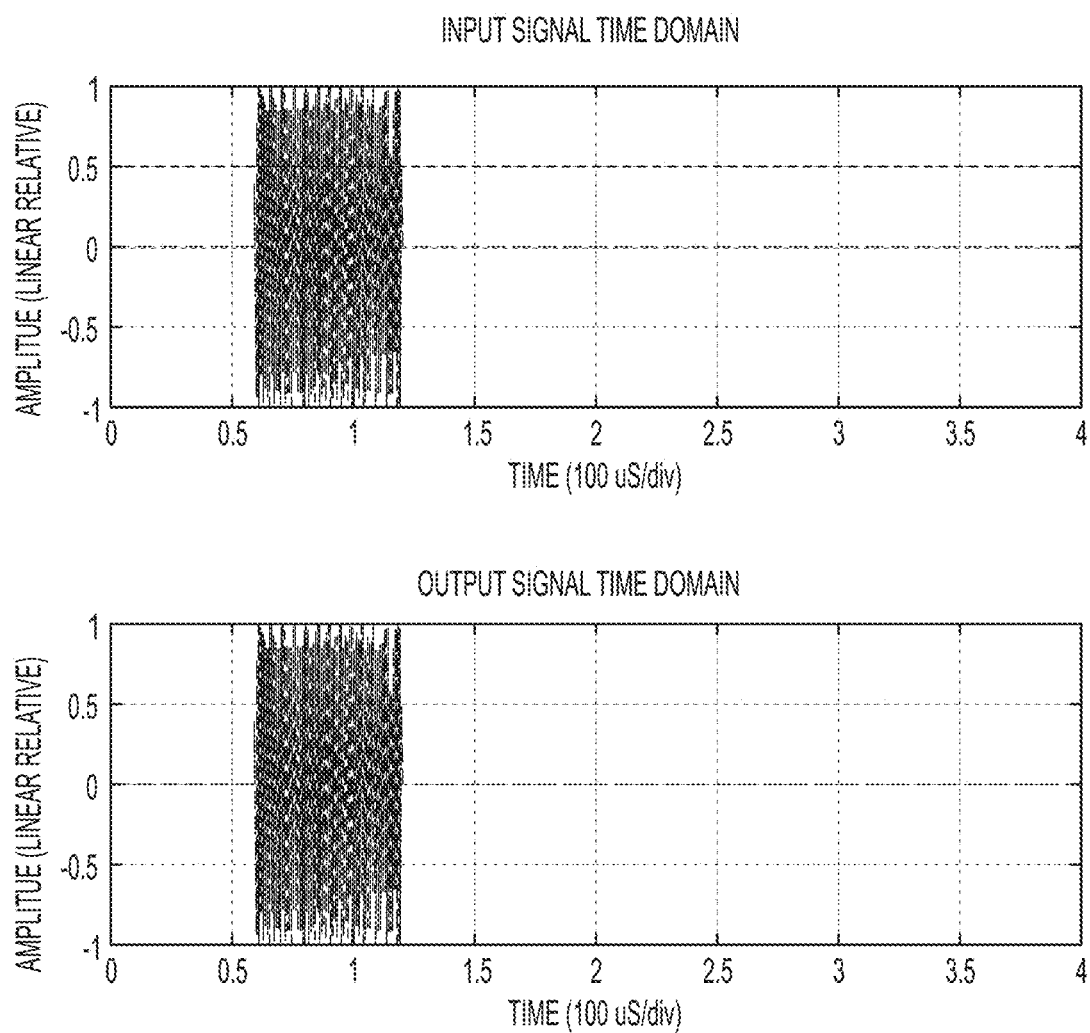
FIG. 11 illustrates, in the time domain, input current to the low-field RF coil and corresponding output from the low-field RF coil with pre-emphasis applied, in accordance with some embodiments of the technology described herein.

As an example, FIG. 9 illustrates how the attenuation of induced to input current (shown in the top panel of FIG. 8) by the RF coil may be counteracted through pre-emphasis. FIG. 9 shows the spectrum (dashed line) of an input waveform pre-emphasized (both in phase and frequency) using the inverse of the coil transfer function. FIG. 10 shows an example of such a pre-emphasis function in the frequency domain. The top panel of FIG. 10 shows how the amplitude of the pre-emphasis function depends on frequency and the bottom panel of FIG. 10 shows how the phase of the pre-emphasis function is a function of frequency. As may be seen in FIG. 9, the sidelobes of the input signal are emphasized such that their subsequent attenuation by the coil transfer function causes the input current to substantially match the output current, as shown in the top panel (input current) and bottom panel (output current) of FIG. 11. In essence, the pre-emphasis using the pre-emphasis function shown in FIG. 10 increased the amplitude of the sidebands in the frequency domain so they are passed at the needed amplitude after the RF coil circuit.

Figure 12A:
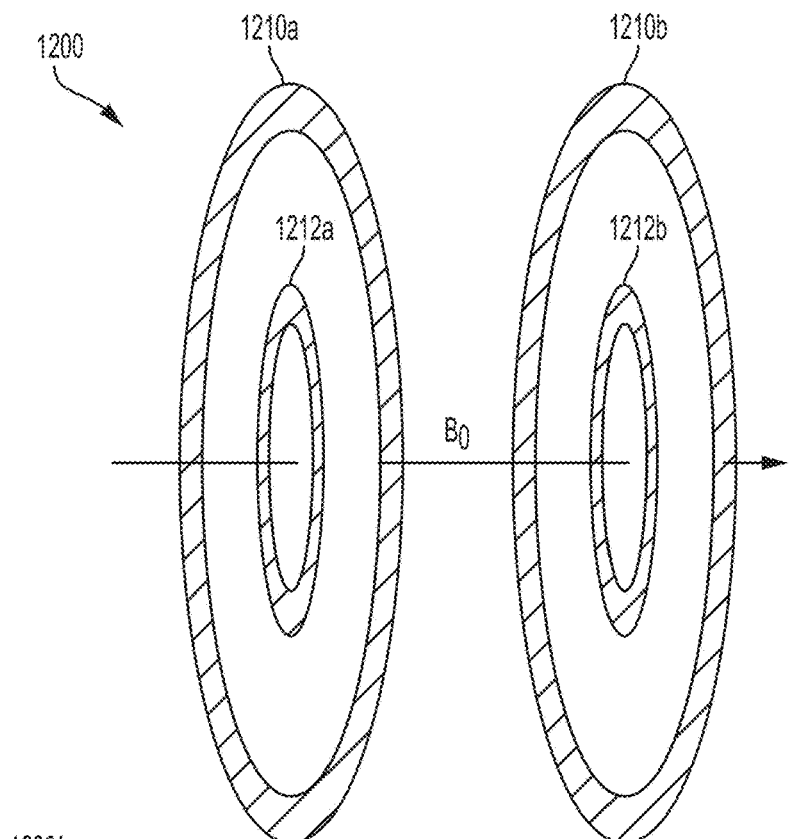
FIGS. 12A and 12B illustrate a bi-planar magnet configuration, in accordance with some embodiments.
Figure 12B:
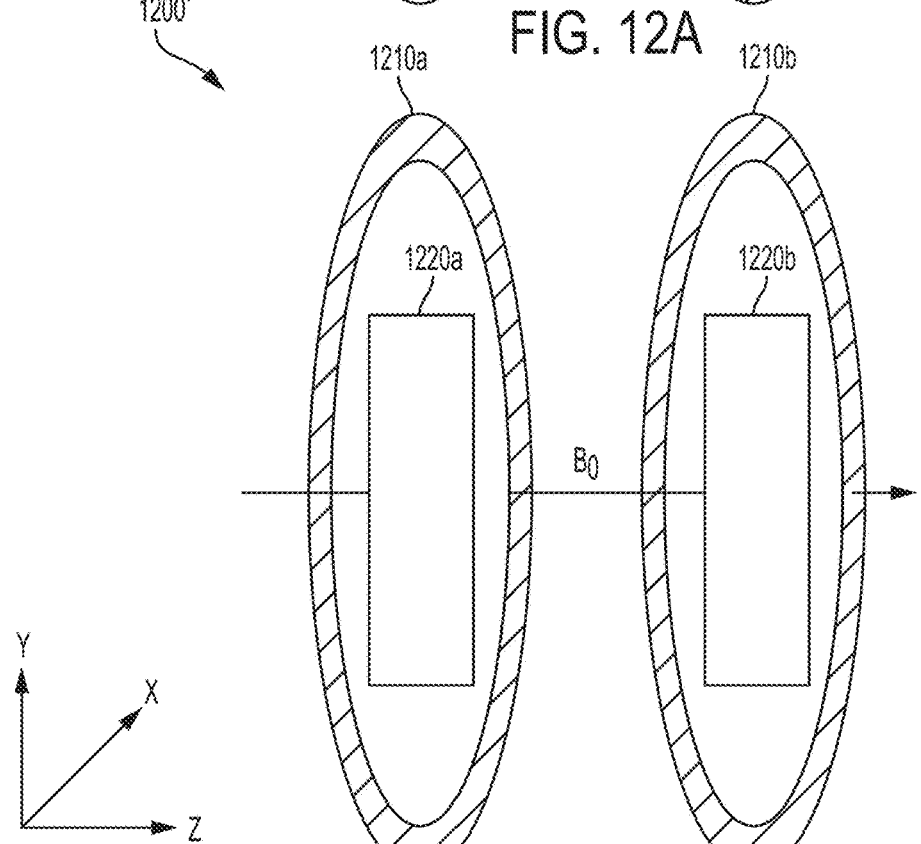

The inventors have developed a number of system configurations on which the pulse sequence techniques described herein can be used to perform low-field MRI. FIGS. 12A and 12B illustrate bi-planar magnetic configurations that may be used in a low-field MRI system in conjunction with the pulse sequence techniques described herein. FIG. 12A schematically illustrates a bi-planar magnet configured to produce, at least in part, a portion of a $B_0$ field suitable for low-field MRI. Bi-planar magnet 1200 comprises two outer coils 1210*a* and 1210*b* and two inner coils 1212*a* and 1212*b*. When appropriate current is applied to the coils, a magnetic field is generated in the direction indicated by the arrow to produce a $B_0$ field having a field of view between the coils that, when designed and constructed appropriately, may be suitable for low-field MRI. The term "coil" is used herein to refer to any conductor or combination of conductors of any geometry having at least one "turn" that conducts current to produce a magnetic field, thereby forming an electromagnet.

It should be appreciated that the bi-planar geometry illustrated in FIG. 12A is generally unsuitable for high-field MRI due to the difficulty in obtaining a $B_0$ field of sufficient homogeneity at high-field strengths. High-field MRI systems typically utilize solenoid geometries (and superconducting wires) to achieve the high field strengths of sufficient homogeneity for high-field MRI. The bi-planar $B_0$ magnet illustrated in FIG. 12A provides a generally open geometry, facilitating its use in many circumstances where high-field MRI systems cannot. For example, generally open geometries provide improved access to patients to facilitate combining low-field MRI with one or more other modalities, techniques and/or surgical procedures, including those that are difficult or impossible using conventional high-field closed bore configurations. Also, open geometries can be used with patients who suffer from claustrophobia and may refuse to be imaged with conventional high-field solenoid coil geometries. Furthermore, the bi-planar design may facilitate use with larger patients as a result of its open design and, in some instances, a generally larger field of view possible at low-field strengths and homogeneity requirements. Moreover, the generally open design facilitates access to the patient being imaged and may improve the ability to position a patient within the field of view, for example, an unconscious, sedated or anesthetized patient.

The inventors have further recognized that open geometries allow access to the patient, facilitating the use of MRI during other clinical procedures such as during a surgery or other procedures where some measure of access to the patient is desired or required. In general, combining MRI with other modalities and/or clinical procedures is not possible using conventional MRI due to the closed configuration and/or the high field-strengths involved. The bi-planar geometry in FIG. 12A is merely exemplary, and other configurations may be used. For example, according to some embodiments, a "one-sided" geometry is used wherein the $B_0$ magnet essentially consists of single side, in contrast to the pair of opposing sides in the bi-planar geometry illustrated.

FIG. 12B illustrates a hybrid bi-planar magnet using laminate techniques to fabricate a $B_0$ magnet or portion thereof and/or to fabricate one or more other magnetics components for use in low-field MRI. For example, in the exemplary bi-planar magnet 1200' illustrated in FIG. 12B, laminate panels 1220*a* and 1220*b* replace inner coils 1212*a* and 1212*b* to produce a hybrid magnet. Laminate panels 1220a and 1220b may include any number of laminate layers having fabricated thereon one or more $B_0$ coils, gradient coils, correction coils and/or shim coils, etc. or portions thereof to facilitate production of the magnetic fields used in low-field MRI. Suitable hybrid magnets using laminate techniques are described in the '652 application. In other embodiments, laminate techniques can be used to implement the $B_0$ magnet in its entirety (e.g., replacing coils 1210a and 1210b).

Exemplary laminate panels 1220a and 1220b may, additionally or alternatively, have fabricated thereon one or more gradient coils, or portions thereof, to encode the spatial location of received MR signals as a function of frequency or phase. According to some embodiments, a laminate panel comprises at least one conductive layer patterned to form one or more gradient coils, or a portion of one or more gradient coils, capable of producing or contributing to magnetic fields suitable for providing spatial encoding of detected MR signals when operated in a low-field MRI system. For example, laminate panel 1220a and/or laminate panel 1220b may comprise a first gradient coil configured to selectively vary the $B_0$ field in a first (X) direction to perform frequency encoding in that direction, a second gradient coil configured to selectively vary the $B_0$ field in a second (Y) direction substantially orthogonal to the first direction to perform phase encoding, and/or a third gradient coil configured to selectively vary the $B_0$ field in a third (Z) direction substantially orthogonal to the first and second directions to enable slice selection for volumetric imaging applications.

Exemplary laminate panels 1220a and 1220b may, additionally or alternatively, include additional magnetics components such as one or more correction or shim coils arranged to generate magnetic fields in support of the system to, for example, increase the strength and/or improve the homogeneity of the $B_0$ field, counteract deleterious field effects such as those created by operation of the gradient coils, loading effects of the object being imaged, other equipment in proximity or being used in conjunction, or to otherwise support the magnetics of the low field MRI system. The bi-planar magnet illustrated in FIGS. 12A and 12B, may be produced using conventional coils, laminate techniques, or a combination of both, and may be used to provide magnetics components for a low-field MRI system, as discussed in further detail below.

Figure 13:
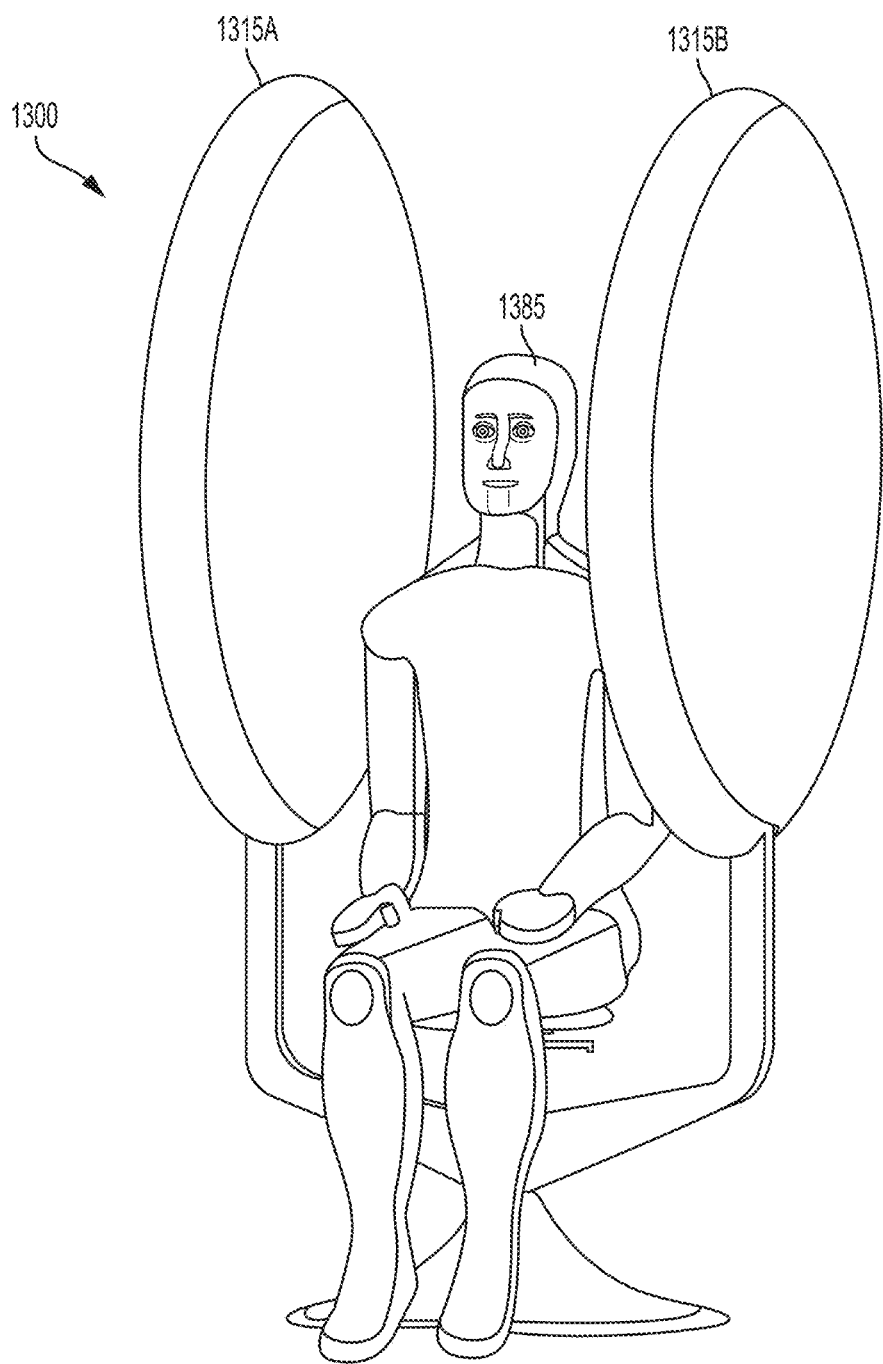
FIG. 13 illustrates an exemplary seated bi-planar low-field MRI system for use in conjunction with one or more other modalities.

FIG. 13 illustrates system 1300 showing a patient 1385 seated within the field of view of bi-planar magnets 1315A and 1315B comprising magnetics components configured to perform low-field MRI with an outer covering or housing, which may further comprise other components such as internal shielding, electrical connections, power and control electronics, etc., and which may generally provide a measure of environmental protection for low-field magnetics components (e.g., B0 magnet, gradient coils, transmit/receive coils, etc.).

Figure 14A:
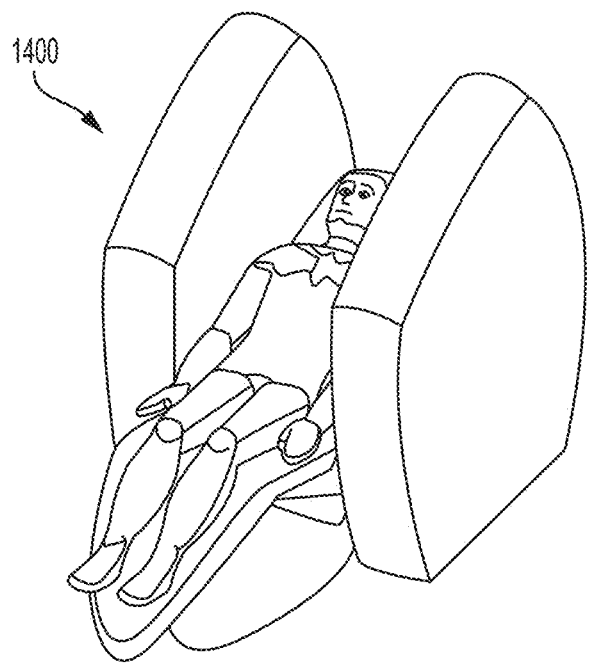
FIGS. 14A and 14B illustrate exemplary reclining bi-planar low-field MRI systems for use in conjunction with one or more other modalities.
Figure 14B:
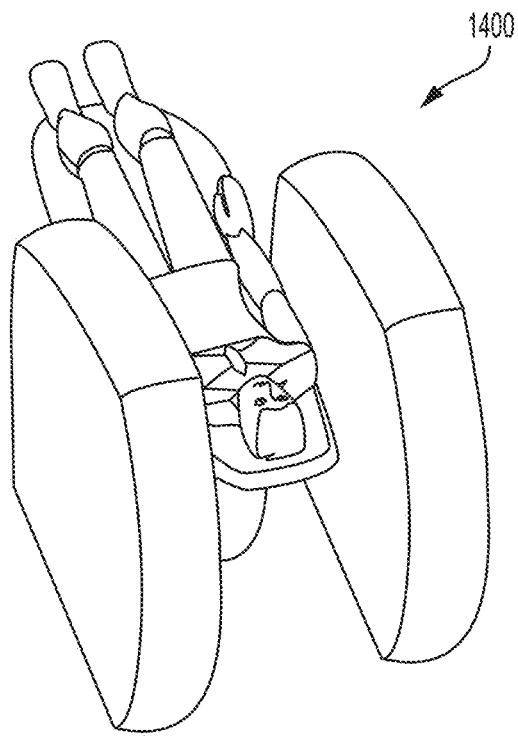

FIGS. 14A and 14B show a system 1400 having a reclining configuration in which the magnetics components 1410A and 1410B are arranged within an frame comprising a seating portion 1435 adjustably oriented at an angle to accommodate a patient being placed between the magnetics components in a reclined position. The reclining portion of the system may be adjustable to facilitate a desired positioning of the patient between the magnetics components so that the desired portion of the patient is located within the field of view of the magnet. Additionally or alternatively, the magnetics components may be adjustable within enclosure 1415 to provide additional flexibility in positioning the magnetics relative to the patient. Magnetics components 1410A and 1410B may be connected via one or more suitable cables to power electronics, which may be mounted on a rack or housed with another suitable transportable structure to facilitate the portability of the MRI system. These example systems are generally open and thereof may have the advantages discussed above.

Figure 15A:
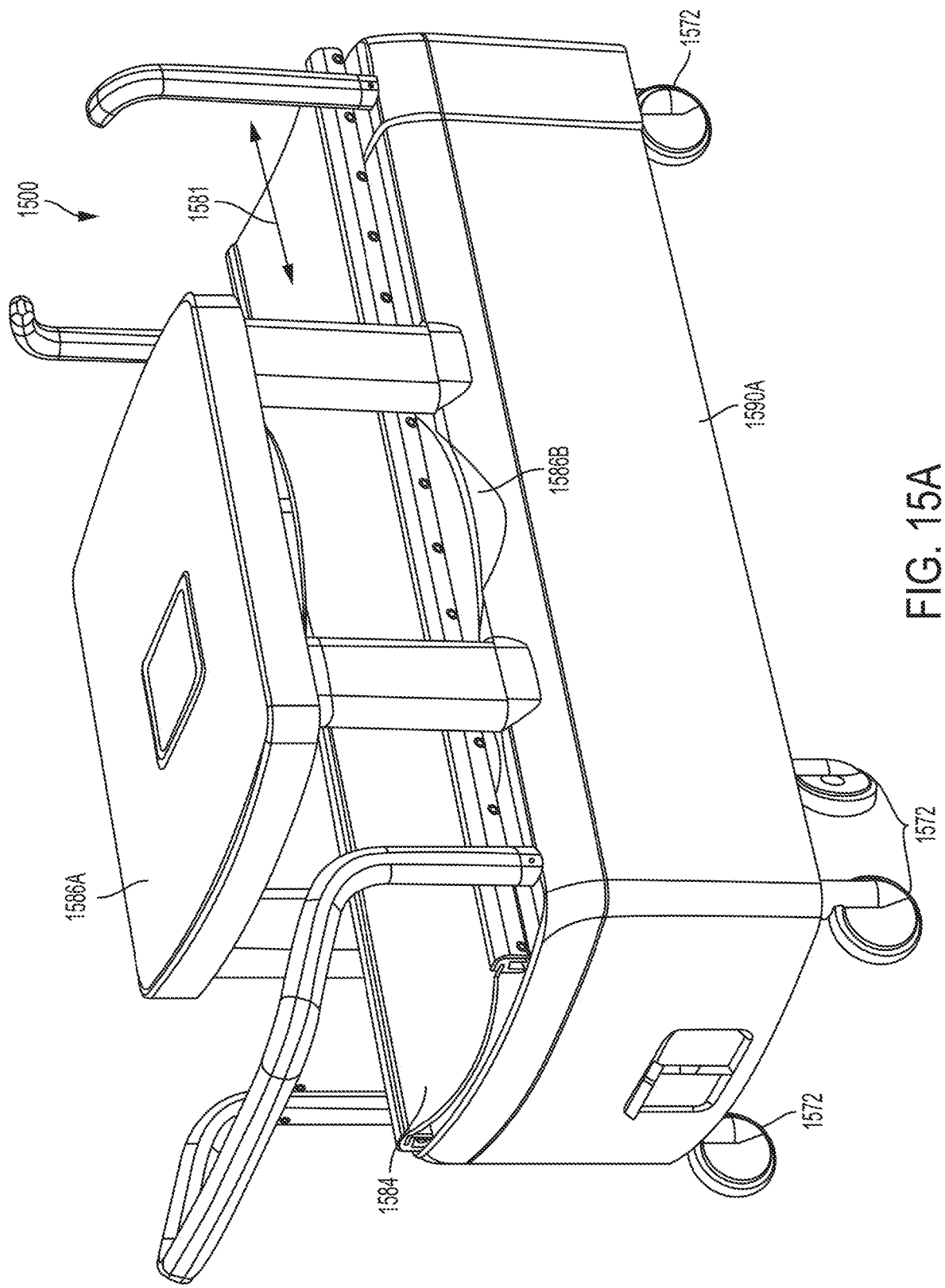
FIGS. 15A and 15B illustrate a transportable low-field MRI system, in accordance with some embodiments.
Figure 15B:
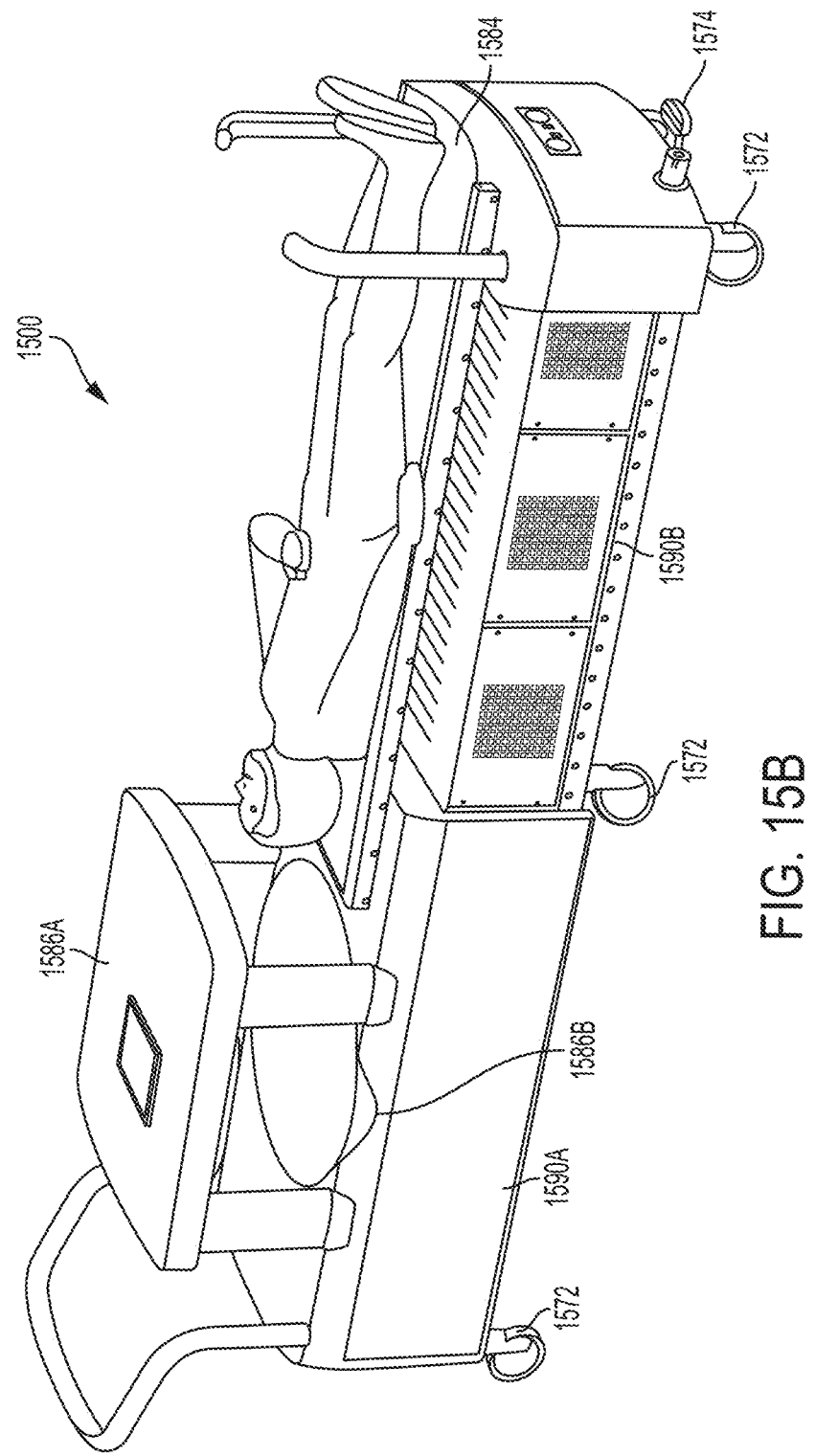

FIGS. 15A-15B illustrate a portable or cartable low-field MRI system 1500 suitable for use in performing techniques described herein, in accordance with some embodiments. System 1500 may include magnetic and power components, and potentially other components (e.g., thermal management, console, etc.), arranged together on a single generally transportable and transformable structure. System 1500 may be designed to have at least two configurations; a configuration adapted for transport and storage, and a configuration adapted for operation. FIG. 15A shows system 1500 when secured for transport and/or storage and FIG. 15B shows system 1500 when transformed for operation. System 1500 comprises a portion 1590A that can be slid into and retracted from a portion 1590B when transforming the system from its transport configuration to its operation configuration, as indicated by the arrows shown in FIG. 15B. Portion 1590A may house power electronics, console (which may comprise an interface device such as a touch panel display) and thermal management. Portion 1590A may also include other components used to operate system 1500 as needed. The transportable system includes castors or wheels 1572 to allow the system to be rolled to a desired location and a brake 1574 (see FIG. 15B) to fix the system when the desired location is reached.

Portion 1590B comprises magnetics components of low-field MRI system 1500. When transformed to the configuration adapted for operating the system to perform MRI (as shown in FIG. 15B), supporting surfaces of portions 1590A and 1590B provide a surface on which the patient can lie. A slide-able bed or surface 1584 may be provided to facilitate sliding the patient into position so that a portion of the patient to be imaged is within the field of view of the low-field MRI magnetics components. System 1500 provides for a portable compact configuration of a low-field MRI system that facilitates access to the device in circumstances where it conventionally is not available.

FIGS. 15A-15B illustrate an example of a convertible low field MRI system that utilizes a bi-planar magnet forming an imaging region between housings 1586A and 1586B. Housings 1586A and 1586B house magnetics components for the convertible system 1500. According to some embodiments, the magnetics components may be produced, manufactured and arranged using exclusively laminate techniques, exclusively traditional techniques, or using a combination of both (e.g., using hybrid techniques). The convertible low-field MRI system 1500 allows the system to be brought to the patient to facilitate operation in a wide variety of circumstances.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a non-transitory computer readable storage medium (or multiple non-transitory computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A low-field magnetic resonance imaging (MRI) system, comprising:
   a plurality of magnetics components comprising:
   a $B_0$ magnetic component configured to produce a low-field main magnetic field $B_0$;
   at least one gradient coil configured to, when operated, provide spatial encoding of emitted magnetic resonance signals; and
   at least one radio frequency component configured to acquire magnetic resonance data when operated; and
   at least one controller that operates one or more of the plurality of magnetics components in accordance with at least one pulse sequence having a plurality of pulse repetition periods over which magnetic resonance signals are produced and detected, wherein the at least one controller is configured to operate the at least one gradient coil to produce a gradient field throughout each of the plurality of pulse repetition periods, and
   wherein the at least one controller is configured to apply at least one RF pulse, and wherein applying the at least one RF pulse comprises generating at least one RF pulse of a duration and amplitude to deflect a net magnetization vector of a subject being imaged by an angle smaller than 30 degrees.

2. The low-field MRI system of claim 1, further comprising:
   at least one non-transitory computer readable medium communicatively coupled to the at least one controller and storing at least one parameter for the at least one pulse sequence,
   wherein the at least one controller is configured to operate the one or more of the plurality of magnetics components at least in part by:
   accessing the at least one parameter stored on the at least one non-transitory computer readable storage medium; and
   operating the one or more of the plurality of magnetics components in accordance with the at least one parameter.

3. The low-field MRI system of claim 1, wherein the $B_0$ magnetic component is configured to produce a B0 field having a strength equal to or less than approximately 0.2 T and greater than or equal to approximately 0.1 T.

4. The low-field MRI system of claim 1, wherein $B_0$ magnetic component is configured to produce a B0 field having a strength equal to or less than approximately 0.1 T and greater than or equal to approximately 50 mT.

5. The low-field MRI system of claim 1, wherein the $B_0$ magnetic component is configured to produce a B0 field having a strength equal to or less than approximately 50 mT and greater than or equal to approximately 20 mT.

6. The low-field MRI system of claim 1, wherein the $B_0$ magnetic component is configured to produce a B0 field having a strength equal to or less than approximately 20 mT and greater than or equal to approximately 10 mT.

7. A low-field magnetic resonance imaging (MRI) system comprising:
   a plurality of magnetics components comprising at least one first magnetics component configured to produce a low-field main magnetic field $B_0$ and at least one second magnetics component configured to acquire magnetic resonance data when operated; and
   at least one controller that operates one or more of the plurality of magnetics components in accordance with at least one pulse sequence, wherein the at least one controller is configured to operate the one or more of the plurality of magnetics components in accordance with the pulse sequence at least in part by performing a set of acts including:
   (A) applying a plurality of gradient fields;
   (B) while applying the plurality of gradient fields:
   applying at least one RF pulse comprising generating at least one RF pulse of a duration and amplitude to deflect a net magnetization vector of a subject being imaged by an angle smaller than 30 degrees; and
   after a threshold amount of time elapses after application of the at least one RF pulse, acquiring a magnetic resonance signal; and
   (C) adjusting strengths of at least one of the plurality of gradient fields to at least one other value.

8. A low-field magnetic resonance imaging (MRI) comprising:
   a plurality of magnetics components comprising at least one first magnetics component configured to produce a low-field main magnetic field $B_0$ and at least one second magnetics component configured to acquire magnetic resonance data when operated; and
   at least one controller that operates one or more of the plurality of magnetics components in accordance with at least one pulse sequence, wherein the at least one controller is configured to operate the one or more of the plurality of magnetics components in accordance with the pulse sequence at least in part by performing a set of acts including:
   (A) applying a plurality of gradient fields;
   (B) while applying the plurality of gradient fields:
   applying at least one RF pulse, wherein applying the at least one RF pulse comprises pre-emphasizing, based at least on a transfer function of a transmit coil of the low-field MRI system, the at least one RF pulse to obtain at least one pre-emphasized RF pulse, and transmitting the at least one pre-emphasized RF pulse using the transmit coil; and after a threshold amount of time elapses after application of the at least one RF pulse, acquiring a magnetic resonance signal; and (C) adjusting strengths of at least one of the plurality of gradient fields to at least one other value.

9. The low-field MRI system of claim 7, wherein the set of acts (A), (B), and (C) is performed in 1-25 ms.

10. The low-field MRI system of claim 7, wherein the at least one first magnetics component comprises a $B_0$ magnetic component configured to produce the low-field main magnetic field $B_0$, wherein the $B_0$ magnetic component is configured to produce a B0 field having a strength equal to or less than approximately 0.2 T and greater than or equal to approximately 0.1 T.

11. The low-field MRI system of claim 7, wherein the at least one first magnetics component comprises a $B_0$ magnetic component configured to produce the low-field main magnetic field $B_0$, wherein the $B_0$ magnetic component is configured to produce a B0 field having a strength equal to or less than approximately 0.1 T and greater than or equal to approximately 50 mT.

12. The low-field MRI system of claim 7, wherein the at least one first magnetics component comprises a $B_0$ magnetic component configured to produce the low-field main magnetic field $B_0$, wherein the $B_0$ magnetic component is configured to produce a B0 field having a strength equal to or less than approximately 50 mT and greater than or equal to approximately 20 mT.

13. The low-field MRI system of claim 7, wherein the at least one first magnetics component comprises a $B_0$ magnetic component configured to produce the low-field main magnetic field $B_0$, wherein the $B_0$ magnetic component is configured to produce a B0 field having a strength equal to or less than approximately 20 mT and greater than or equal to approximately 10 mT.

14. A low-field magnetic resonance imaging (MRI) system, comprising:
a plurality of magnetics components comprising at least one first magnetics component configured to produce a low-field main magnetic field $B_0$ and at least one second magnetics component configured to acquire magnetic resonance data when operated; and
at least one controller that operates one or more of the plurality of magnetics components in accordance with at least one pulse sequence, wherein the controller is configured to operate the one or more of the plurality of magnetics components in accordance with the at least one pulse sequence at least in part by performing a set of acts including:
(A) applying an RF pulse;
(B) after applying the RF pulse, applying a plurality of gradient fields;
(C) after applying the plurality of gradient fields, acquiring a magnetic resonance signal while applying one of the plurality of gradient fields;
(D) after acquiring the magnetic resonance signal, refocusing a magnetic moment of a subject being imaged at least in part by applying gradient fields with strengths and/or polarities selected such that a sum of the field strengths of each gradient field across a duration of a pulse repetition period of the at least one pulse sequence is zero.

15. The low-field MRI system of claim 14, wherein the flip angle that reduces the effect of $B_0$ inhomogeneities on the net transverse magnetization is in a range of 60-80 degrees.

16. The low-field MRI system of claim 14, wherein the flip angle that reduces the effect of $B_0$ inhomogeneities on the net transverse magnetization is in a range of 65-75 degrees.

17. The low-field MRI system of claim 14, wherein the flip angle that reduces the effect of $B_0$ inhomogeneities on the net transverse magnetization is smaller than ninety degrees.

18. The low-field MRI system of claim 1 wherein the
at least one controller that operates the at least one radio frequency component in accordance with a pulse sequence designed to compensate for inhomogeneity in one or more of the plurality of magnetic fields at least in part by causing one or more of the plurality of magnetics components to apply a series of RF pulses having at least one parameter that varies during a respective series of pulse repetition periods of the pulse sequence.

19. The low-field MRI system of claim 18, wherein the pulse sequence is designed to compensate for inhomogeneity in the main magnetic field.

20. The low-field MRI system of claim 18, wherein the plurality of magnetic fields includes a $B_1$ magnetic field and the pulse sequence is designed to compensate for inhomogeneity in the $B_1$ magnetic field.

21. The low-field MRI system of claim 20, wherein flip angle induced by the RF pulses in the series of RF pulses varies during the respective series of pulse repetition periods.

22. The low-field MRI system of claim 18, wherein phase of RF pulses in the series of RF pulses varies during the respective series of pulse repetition periods.

23. The low-field MRI system of claim 18, wherein a center frequency of RF pulses in the series of RF pulses varies during the respective series of pulse repetition periods.

24. The low-field MRI system of claim 8, wherein the at least one first magnetics component is configured to produce a B0 field having a strength equal to or less than approximately 0.2 T and greater than or equal to approximately 0.1 T.

25. The low-field MRI system of claim 8, wherein the at least one first magnetics component is configured to produce a B0 field having a strength equal to or less than approximately 0.1 T and greater than or equal to approximately 50 mT.

26. The low-field MRI system of claim 8, wherein the at least one first magnetics component is configured to produce a B0 field having a strength equal to or less than approximately 50 mT and greater than or equal to approximately 20 mT.

27. The low-field MRI system of claim 8, wherein the at least one first magnetics component is configured to produce a B0 field having a strength equal to or less than approximately 20 mT and greater than or equal to approximately 10 mT.

28. The low-field MRI system of claim 2, wherein the at least one parameter includes a field strength at which the at least one controller operates the at least one gradient coil.

29. The low-field MRI system of claim 28, wherein the at least one controller is configured to change a field strength of the at least one gradient coil for each of the plurality of pulse repetition periods.

30. The low-field MRI system of claim 1, wherein the at least one gradient coil comprises at least one x-gradient coil, at least one y-gradient coil, and at least one z-gradient coil to provide spatial encoding in x, y, and z directions, respectively, and wherein the at least one controller is configured to operate the at least one x-gradient coil, the at least one y-gradient coil, and the at least one z-gradient coil to produce respective x, y and z gradient fields throughout each of the plurality of pulse repetition periods.

31. A low-field magnetic resonance imaging (MRI) comprising:
   a plurality of magnetics components comprising:
   a $B_0$ magnetic component configured to produce a low-field main magnetic field $B_0$;
   at least one gradient coil configured to, when operated, provide spatial encoding of emitted magnetic resonance signals; and
   at least one radio frequency component configured to acquire magnetic resonance data when operated; and
   at least one controller that operates one or more of the plurality of magnetics components in accordance with at least one pulse sequence having a plurality of pulse repetition periods over which magnetic resonance signals are produced and detected, wherein the at least one controller is configured to operate the at least one gradient coil to produce a gradient field throughout each of the plurality of pulse repetition periods and,
   wherein the at least one controller is configured to apply at least one RF pulse, and wherein applying the at least one RF pulse comprises pre-emphasizing, based at least on a transfer function of a transmit coil of the low-field MRI system, the at least one RF pulse to obtain at least one pre-emphasized RF pulse, and transmitting the at least one pre-emphasized RF pulse using the transmit coil.

32. The low-field MRI system of claim 8, wherein applying the at least one RF pulse comprises applying a plurality of RF excitation pulses associated with a flip angle that reduces effect of $B_0$ inhomogeneity on net transverse magnetization, and wherein the flip angle that reduces the effect of $B_0$ inhomogeneities on the net transverse magnetization is in a range of 60-80 degrees.

33. The low-field MRI system of claim 8, wherein applying the at least one RF pulse comprises applying a plurality of RF excitation pulses associated with a flip angle that reduces effect of $B_0$ inhomogeneity on net transverse magnetization, and wherein the flip angle that reduces the effect of $B_0$ inhomogeneities on the net transverse magnetization is in a range of 65-75 degrees.

34. The low-field MRI system of claim 8, wherein applying the at least one RF pulse comprises applying a plurality of RF excitation pulses associated with a flip angle that reduces effect of $B_0$ inhomogeneity on net transverse magnetization, and wherein the flip angle that reduces the effect of $B_0$ inhomogeneities on the net transverse magnetization is smaller than ninety degrees.

35. The low-field MRI system of claim 8, wherein the set of acts (A), (B), and (C) is performed in 1-25 ms.

* * * * *